(12) United States Patent
Watanabe et al.

(10) Patent No.: US 11,181,474 B2
(45) Date of Patent: Nov. 23, 2021

(54) TERAHERTZ WAVE SIGNAL ANALYSIS DEVICE, TERAHERTZ WAVE SIGNAL ANALYSIS METHOD, AND TERAHERTZ WAVE SIGNAL ANALYSIS PROGRAM

(71) Applicant: FEMTO Deployments Inc., Okayama (JP)

(72) Inventors: Akira Watanabe, Okayama (JP); Tadashi Okuno, Okayama (JP); Takeji Ueda, Okayama (JP)

(73) Assignee: FEMTO Deployments Inc., Okayama (JP)

( * ) Notice: Subject to any disclaimer, the term of this patent is extended or adjusted under 35 U.S.C. 154(b) by 358 days.

(21) Appl. No.: 16/467,301

(22) PCT Filed: Dec. 11, 2017

(86) PCT No.: PCT/JP2017/044290
§ 371 (c)(1),
(2) Date: Jun. 6, 2019

(87) PCT Pub. No.: WO2018/110481
PCT Pub. Date: Jun. 21, 2018

(65) Prior Publication Data
US 2019/0369016 A1 Dec. 5, 2019

(30) Foreign Application Priority Data
Dec. 15, 2016 (JP) .............................. JP2016-243798

(51) Int. Cl.
*G01N 21/3581* (2014.01)
*G01N 21/3577* (2014.01)
(Continued)

(52) U.S. Cl.
CPC ..... *G01N 21/3581* (2013.01); *G01N 21/3577* (2013.01); *G01R 23/16* (2013.01); *G06K 9/0053* (2013.01); *G01N 2201/129* (2013.01)

(58) Field of Classification Search
CPC . G01N 21/3581; G01N 21/3586; G01J 3/027; G01J 3/42; G06K 9/0053; G01R 23/16
See application file for complete search history.

(56) References Cited

U.S. PATENT DOCUMENTS 4,963,745 A * 10/1990 Maggard .............. G01N 21/359
250/343
2005/0156120 A1 7/2005 Arnone et al.
(Continued)

FOREIGN PATENT DOCUMENTS

JP H11 023562 A 1/1999
JP H11108825 A 4/1999
(Continued)

OTHER PUBLICATIONS

EP Search Report dated Sep. 28, 2020 to the counterpart European patent application No. 17880672.5.
(Continued)

*Primary Examiner* — Michael C Bryant
(74) *Attorney, Agent, or Firm* — Polsinelli PC

(57) ABSTRACT

A terahertz wave signal analysis device includes a fitting processing unit 13 that fits synthetic waveforms of a plurality of normal distribution functions which differ in at least one of a center frequency, an amplitude, and a width to a frequency spectrum obtained from a terahertz wave signal and a graph generating unit 14 that generates a graph using at least one of a center frequency, an amplitude, and a width of a plurality of normal distribution functions used in the fitting as parameters, and it is possible to visualize a feature corresponding to a characteristic of a sample in the form of a graph in an easy-to-understand manner by approximating (Continued)

a frequency spectrum which does not clearly appear because a difference in the characteristic of the sample becomes a feature of a waveform by synthetic waveforms of a plurality of normal distribution functions in a form in which the characteristic of the sample is taken over and generating a graph on the basis of parameters of a plurality of normal distribution functions used in the approximation.

22 Claims, 12 Drawing Sheets

(51) Int. Cl.
*G06K 9/00* (2006.01)
*G01R 23/16* (2006.01)

(56) References Cited

U.S. PATENT DOCUMENTS

| | | | | |
|---|---|---|---|---|
| 2012/0318967 | A1* | 12/2012 | Itsuji ................ | G01J 3/28 250/252.1 |
| 2019/0078938 | A1* | 3/2019 | Favero ................ | H03C 7/00 |

FOREIGN PATENT DOCUMENTS

| | | |
|---|---|---|
| JP | 2000287953 A | 10/2000 |
| JP | 2001141648 A | 5/2001 |
| JP | 2001174412 A | 6/2001 |
| JP | 2008301495 A | 12/2008 |
| JP | 4328526 B2 | 9/2009 |
| JP | 2011127950 A | 6/2011 |
| JP | 2011191128 A | 9/2011 |
| JP | 2014122875 A | 7/2014 |
| JP | 2015049096 A | 3/2015 |
| JP | 2016 188777 A | 11/2016 |
| WO | WO 2011/111385 A1 | 9/2011 |

OTHER PUBLICATIONS

Savitzky et al., "Smoothing and Differentiation of Data by Simplified Least Squares Procedure", Analytical Chemistry, vol. 36, No. 8, Jul. 1964, pp. 1627-1639.

"Comments on Smoothing and Differentiation of Data by Simplified Least Square Procedure", Analytical Chemistry, vol. 44, No. 11, Sep. 1972, pp. 1906-1909.

* cited by examiner (a)

(b)

TERAHERTZ WAVE SIGNAL ANALYSIS DEVICE, TERAHERTZ WAVE SIGNAL ANALYSIS METHOD, AND TERAHERTZ WAVE SIGNAL ANALYSIS PROGRAM

CROSS REFERENCE TO RELATED APPLICATIONS

This application is a National Phase filing under 35 U.S.C. § 371 of PCT/JP2017/044,290 filed on Dec. 11, 2017; which application in turn claims priority to Application No. 2016-243,798 filed in Japan on Dec. 15, 2016. The entire contents of each application are hereby incorporated by reference.

TECHNICAL FIELD

The present invention relates to a terahertz wave signal analysis device, a terahertz wave signal analysis method, and a terahertz wave signal analysis program, and more particularly, to a technique suitable for use in a device that analyzes a characteristic of a terahertz wave passing through a sample placed on an optical path of a spectral device.

BACKGROUND ART

In the past, a spectral device that measures a characteristic of a substance using a terahertz wave which is a sort of an electromagnetic wave has been provided. Spectroscopies are classified into several techniques depending on a physical quantity measured by an electromagnetic wave, and there are absorption spectroscopy and reflection spectroscopy. In the absorption spectroscopy, an electromagnetic wave is caused to pass through a sample which is a spectroscopic measurement target, and a physical property or a chemical property of a sample is measured from a change in the electromagnetic wave caused by interaction between the electromagnetic wave and the sample while passing through the sample. Further, the reflection spectroscopy is used for spectroscopic measurement of a material that does not transmit light or a material that scatters light, and a property of a sample is measured by analyzing reflected light from a sample surface.

A frequency spectrum of a molecule observed by the spectroscopic measurement has a spectral structure unique to the molecule. In particular, in absorption spectroscopy using a terahertz wave, intermolecular vibration caused by a hydrogen bond or the like is observed. However, intermolecular interaction that occurs in a sample in response to a terahertz wave has a complicated process and is likely to lack a clear feature since spectrums overlap. For this reason, there is a problem in that it is difficult to know a part of a terahertz spectrum in which a feature of a sample appears or a waveform in which a feature of a sample appears, and it is extremely difficult to find the feature.

Note that, a polarization sensitive terahertz wave detector for terahertz time domain spectroscopic analysis that is suitable for measuring a difference in transmittance or absorptivity on the basis of a difference in tissue of a substance and visualizing it has been known (see, for example, Patent Document 1). In the detector disclosed in Patent Document 1, a polarization state can be evaluated by one measurement by using a THz antenna using two or more sets of electrodes. Further, when a minute central opening is formed, it is possible to detect the polarization state even when it is a signal of a 0.25 to 0.8 THz band.

A light absorbance measurement value estimation device that calculates component content of a sample for standard curve evaluation from light absorbance and displays a result is also known (see, for example, Patent Document 2). In the device disclosed in Patent Document 2, an electromagnetic wave of an ultraviolet portion, a visible portion, or a near infrared portion region is irradiated to a measurement sample having a known measurement value, and absorption signal values of two or more wavelengths including no electromagnetic wave of the near infrared portion region are detected. Then, a standard curve is obtained by performing multiple regression analysis using the absorption signal values of the two or more wavelengths and the measurement value of the measurement sample as explanatory variables and an objective variable respectively, and a measurement value is estimated from the absorption signal values of the two or more wavelengths of the measurement sample having an unknown measurement value. Further, a correlation graph between the estimated measurement value and a measurement value obtained by a visual observation technique is obtained and displayed.

Patent Document 1: JP-A-2015-49096
Patent Document 2: JP-A-2001-141648

DISCLOSURE OF THE INVENTION

However, a specific method of visualizing a difference in transmittance or absorptivity is not disclosed in Patent Document 1. Further, in the device disclosed in Patent Document 2, the correlation graph between the measurement value estimated from the standard curve obtained by the multiple regression analysis and the measurement value measured by the visual observation technique is just displayed, and a feature corresponding to a characteristic of a sample is unable to be determined by viewing it.

The present invention was made to solve the above-mentioned problems, and it is an object of the present invention to provide a technique capable of analyzing the terahertz wave signal detected by the spectral device and visualizing a feature corresponding to a characteristic of a sample in an easy-to-understand manner.

In order to solve the above problems, in the present invention, synthetic waveforms of a plurality of fitting functions are fit to a frequency spectrum obtained from a terahertz wave signal, and a graph different from the frequency spectrum is generated using at least one value deciding properties of a plurality of fitting functions used in the fitting.

According to the present invention configured as described above, a frequency spectrum which does not clearly appear because a difference in the characteristic of the sample becomes a feature of a waveform is approximated by synthetic waveforms of a plurality of fitting functions in a form in which the characteristic of the sample is taken over and a graph is generated on the basis of parameters of a plurality of fitting functions used in the approximation. Since it is possible to indicate a fitting function with a parameter deciding a property thereof, a graph generated on the basis of this parameter is visualized so that a feature corresponding to a characteristic of a sample is easily understood. Accordingly, according to the present invention, it is possible to analyze a terahertz wave signal detected by a spectral device and visualize a feature corresponding to a characteristic of a sample in an easy-to-understand manner.

MODE FOR CARRYING OUT THE INVENTION

First Embodiment

Figure 1:
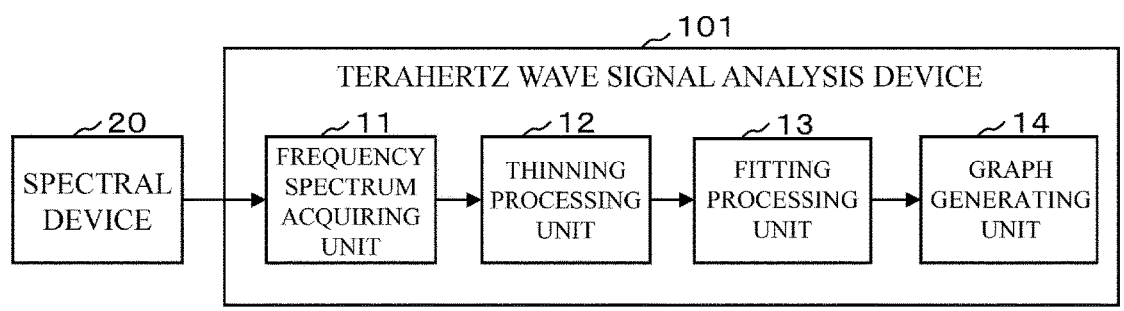
FIG. 1 is a block diagram illustrating an example of a functional configuration of a terahertz wave signal analysis device according to a first embodiment.

Hereinafter, a first embodiment of the present invention will be described with reference to the appended drawings. FIG. 1 is a block diagram illustrating an example of a functional configuration of a terahertz wave signal analysis device according to the first embodiment. A terahertz wave signal analysis device 101 according to the first embodiment analyzes a terahertz wave signal of a sample detected by a spectral device 20, and includes a frequency spectrum acquiring unit 11, a thinning processing unit 12, a fitting processing unit 13, and a graph generating unit 14 as its functional configuration.

Each of the functional blocks 11 to 14 can be constituted by any of hardware, a digital signal processor (DSP), and software. For example, when constituted by software, each of the functional blocks 11 to 14 is actually configured to include a CPU, a RAM, a ROM, and the like of a computer and is realized as a terahertz wave signal analysis program stored in a recording medium such as a RAM, a ROM, a hard disk, or a semiconductor memory operates.

The frequency spectrum acquiring unit 11 obtains a frequency spectrum indicating light absorbance for a frequency on the basis of the terahertz wave signal detected by the spectral device 20. The spectral device 20 causes a sample of a measurement target placed on an optical path to transmit or reflect the terahertz wave and detects the terahertz wave acting on the sample in this manner. In the present embodiment, various known types of spectral devices can be used as the spectral device 20.

Figure 3:
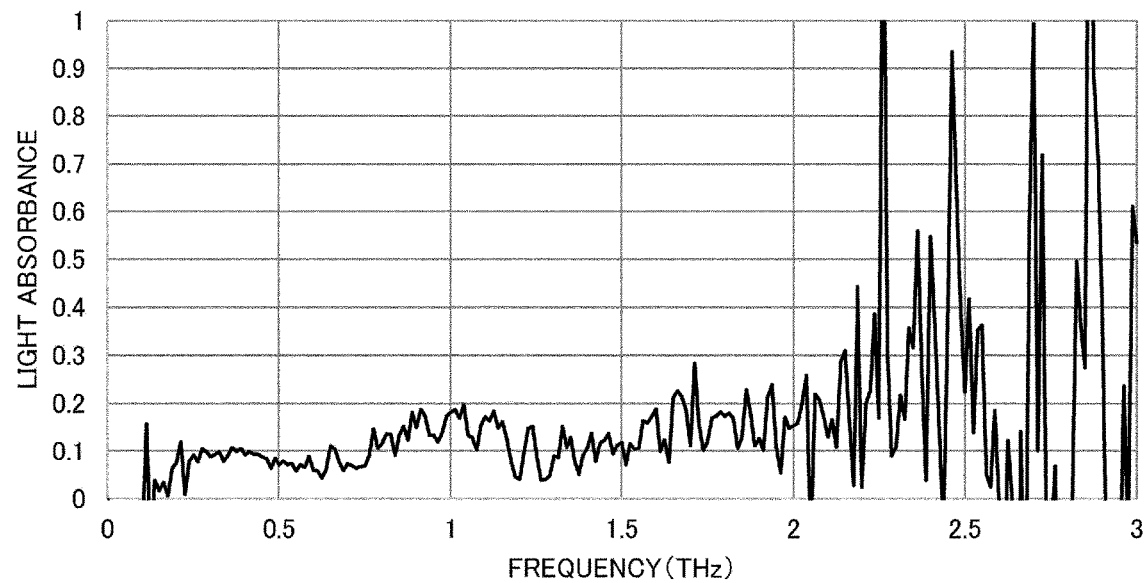
FIG. 3 is a diagram illustrating an example of a frequency spectrum obtained by a frequency spectrum acquiring unit according to the first embodiment.

FIG. 3 is a diagram illustrating an example of the frequency spectrum obtained by the frequency spectrum acquiring unit 11. The frequency spectrum has a different waveform for each sample having a different property, but it is difficult to understand a part of the waveform in which a feature of a sample appears or a waveform in which a feature of a sample appears on the basis of the frequency spectrum. The terahertz wave signal analysis device 101 of the present embodiment analyzes the frequency spectrum and visualizes a feature corresponding to a characteristic of the sample in an easy-to-understand manner.

The thinning processing unit 12 thins out an extreme value at a frequency in which the absorption of the terahertz wave is increased by vapor other than the sample among light absorbance data for each frequency in the frequency spectrum obtained by the frequency spectrum acquiring unit 11. In addition to the sample, there is vapor on the optical path of the spectral device 20. The terahertz wave is also absorbed by the vapor, and thus the acquired frequency spectrum is likely to have a characteristic of the vapor. Therefore, the thinning processing unit 12 performs the process of thinning out the extreme value at the frequency at which the absorption of the terahertz wave by the vapor is increased.

Note that, it is possible to specify the frequency at which the absorption of the terahertz wave by the vapor is increased using, for example, data provided from National Institute of Information and Communications Technology (NICT). NICT publishes data of a radio attenuation factor of air (including vapor) for terahertz wave communication. It is possible to specify the frequency at which the absorption of the terahertz wave by the vapor is increased using this data.

Figure 4:
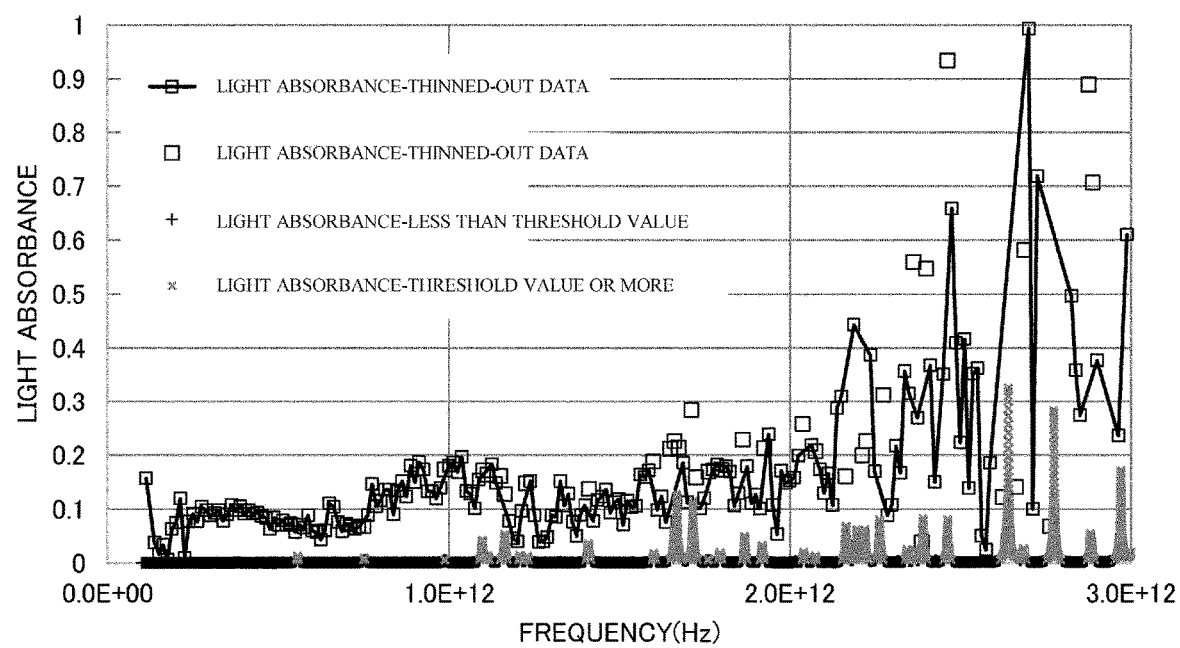
FIG. 4 is a diagram for describing processing content by a thinning processing unit according to the first embodiment.

FIG. 4 is a diagram for describing processing content by the thinning processing unit 12. FIG. 4 illustrates that light absorbance data of the frequency spectrum overlaps data obtained by converting the radio wave attenuation factor of each frequency into light absorbance. The thinning processing unit 12 thins out the extreme value (indicated by □) of the frequency in which the light absorbance converted from the data of NICT is equal to or higher than a set threshold among the light absorbance data for each frequency of the frequency spectrum illustrated in FIG. 4. Note that, here, the example in which the radio attenuation factor is converted to light absorbance, and then the extreme value of the frequency in which the light absorbance is equal to or higher than the set threshold is thinned out is here illustrated, but the present invention is not limited to thereto. For example, the extreme value of the frequency at which the radio wave attenuation factor is equal to or higher than the set threshold may be thinned out.

Note that, it is also possible to construct a vacuum environment or an equivalent environment in which there is very little vapor and install the spectral device 20 in that environment. In this case, the thinning processing unit 12 can be omitted.

The fitting processing unit 13 fits synthetic waveforms of a plurality of normal distribution functions which differ in at least one of a center frequency, an amplitude, and a width to the frequency spectrum obtained by the frequency spectrum acquiring unit 11. In the present embodiment, the fitting processing unit 13 performs a process of fitting the synthetic waveforms of a plurality of normal distribution functions to a plurality of pieces of light absorbance data which are thinned by the thinning processing unit 12.

In other words, under the assumption that the fitting processing unit 13 can approximate the frequency spectrum by the overlap of a plurality of normal distribution waveforms, a plurality of normal distribution functions that minimize a residual error between the light absorbance data at each frequency of the frequency spectrum (a plurality of pieces of light absorbance data thinned out by the thinning processing unit 12) and a value of the synthetic waveform at each frequency corresponding thereto are calculated by an optimization calculation using the center frequency, the amplitude, and the width as variables.

In the present embodiment, the normal distribution function (Gaussian function) is used as an example of the function used for fitting. Further, a 1/e width is used as an example of the width of the normal distribution function. Also, in the present embodiment, the number of normal distribution functions to be synthesized can be set arbitrarily. As will be described later, in the present embodiment, the analysis result of the frequency spectrum is provided in the form of a radar graph, but it is desirable to set the number of normal distribution functions used for fitting to be larger than the number of axes of the radar graph.

Figure 2:
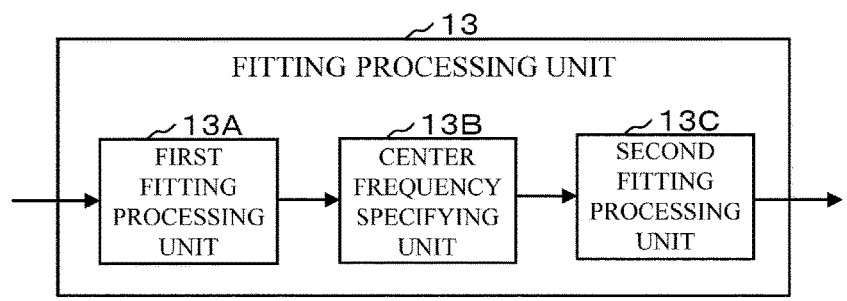
FIG. 2 is a diagram illustrating a specific functional configuration example of a fitting processing unit according to the first embodiment.

FIG. 2 is a diagram illustrating a specific functional configuration example of the fitting processing unit 13. The fitting processing unit 13 includes a first fitting processing unit 13A, a center frequency specifying unit 13B and a second fitting processing unit 13C as a more specific functional configuration as illustrated in FIG. 2. Here, in the present embodiment, terahertz wave signals of a plurality of samples are detected by the spectral device 20, and the processes of the frequency spectrum acquiring unit 11, the thinning processing unit 12, and the fitting processing unit 13 are performed on the respective terahertz wave signals.

The first fitting processing unit 13A sets the center frequency, the amplitude, and the width as the parameters for each of a plurality of frequency spectrums obtained for a plurality of samples and performs fitting on the frequency spectrum with the synthetic waveforms of a plurality of normal distribution functions that differ in at least the center frequency.

Figure 5:
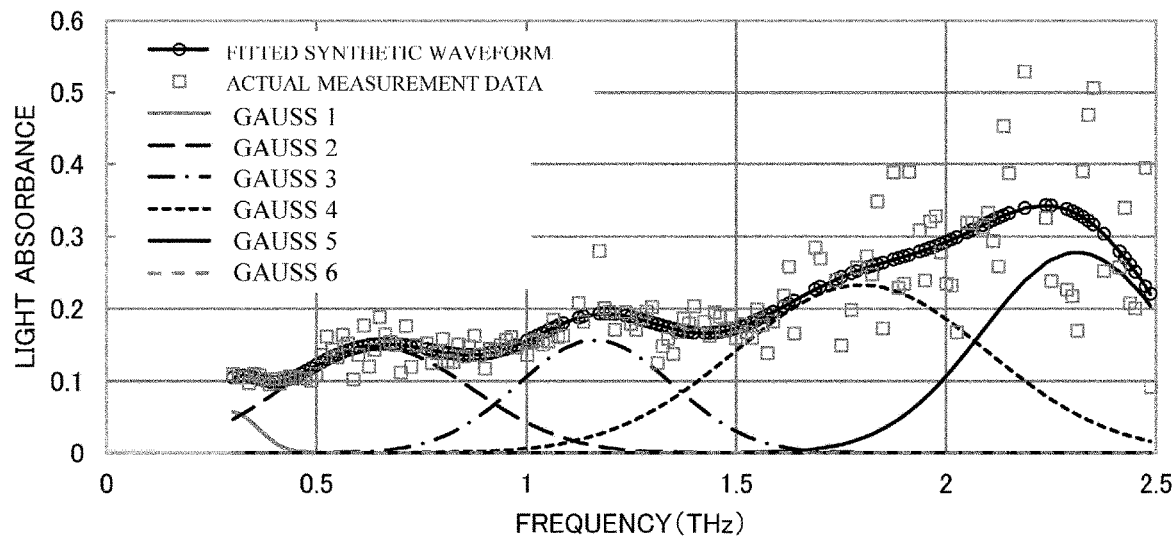
FIG. 5 is a diagram for describing processing content by a first fitting processing unit according to the first embodiment.

FIG. 5 is a diagram for describing processing content by the first fitting processing unit 13A. Note that, FIG. 5 illustrates an example of a state in which fitting is performed on the frequency spectrum of one sample. As illustrated in FIG. 5, the first fitting processing unit 13A performs the optimization calculation so that the residual error between the value of the light absorbance (indicated by □) at each frequency of the frequency spectrum and a value at each frequency on the synthetic waveforms of a plurality of normal distribution functions (Gausses 1 to 6) which are variably set using the center frequency, the amplitude, and the width as the parameters is minimized.

The center frequency specifying unit 13B groups the center frequencies of the normal distribution functions used in plurality of fittings on a plurality of frequency spectrums by the first fitting processing unit 13A and specifies a representative center frequency from each group. For example, the center frequency specifying unit 13B specifies a total of n center frequencies by grouping into units in which the center frequencies of a plurality of normal distribution functions obtained by the fitting process are clustered and specifying each of one or more representative center frequencies from each group.

Figure 6:
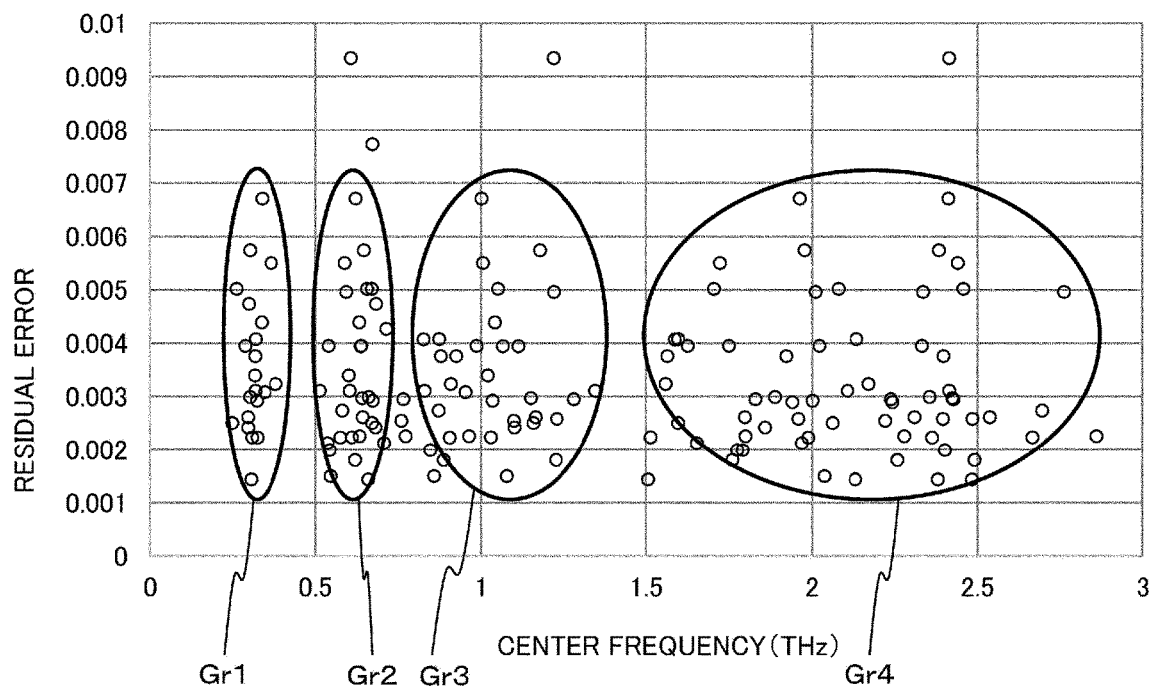
FIG. 6 is a diagram for describing processing content by a center frequency specifying unit according to the first embodiment.

FIG. 6 is a diagram for describing processing content by the center frequency specifying unit 13B. FIG. 6 illustrates the residual error between the value at each center frequency of a plurality of normal distribution functions obtained by the first fitting processing unit 13A on the basis of a plurality of frequency spectrums obtained from a plurality of samples and the value of the light absorbance in a plurality of frequency spectrums, that is, the value at the frequency corresponding to each center frequency.

As illustrated in FIG. 6, a plurality of center frequencies exist as a cluster around 0.2 to 0.4 THz, a plurality of center frequencies exist as a cluster around 0.5 to 0.7 THz, a plurality of center frequencies exist as a cluster around 0.8 to 1.4 THz, and a plurality of center frequencies exist as a cluster around 1.5 to 2.8 THz. The center frequency specifying unit 13B sets four groups Gr1 to Gr4 for each center frequency cluster.

Then, the center frequency specifying unit 13B specifies the center frequency of one or more representatives from each of groups Gr1 to Gr4. The method of identifying the representative frequency can be set arbitrarily. For example, it is possible to specify one frequency in which a plurality of center frequencies are most concentrated in a group as a representative. Alternatively, an average value of a plurality of center frequencies belonging to a group may be calculated, and one center frequency closest to the average value may be specified as a representative. Also, regarding groups in which the frequency range of the group is wide, and a plurality of center frequencies are relatively widely distributed such as the groups Gr3 and Gr4, a plurality of center frequencies may be specified as a representative at regular intervals.

Note that, when grouping is performed for each cluster of center frequencies, only the center frequency in which the value of the residual error is smaller than a predetermined value may be used.

The second fitting processing unit 13C fixes the n center frequencies specified by the center frequency specifying unit 13B for each of a plurality of frequency spectrums obtained for a plurality of samples and performs fitting on the frequency spectrum again with the synthetic waveforms of the n normal distribution functions using the amplitude and the width as the parameters. In other words, the second fitting processing unit 13C calculates the n normal distribution functions (the center frequency specified by the center frequency specifying unit 13B) in which the residual error between the value of light absorbance at each frequency of the frequency spectrum and the value of the synthetic waveform at each frequency corresponding thereto is minimized through the optimization calculation using the amplitude and the width as variables.

Figure 7:
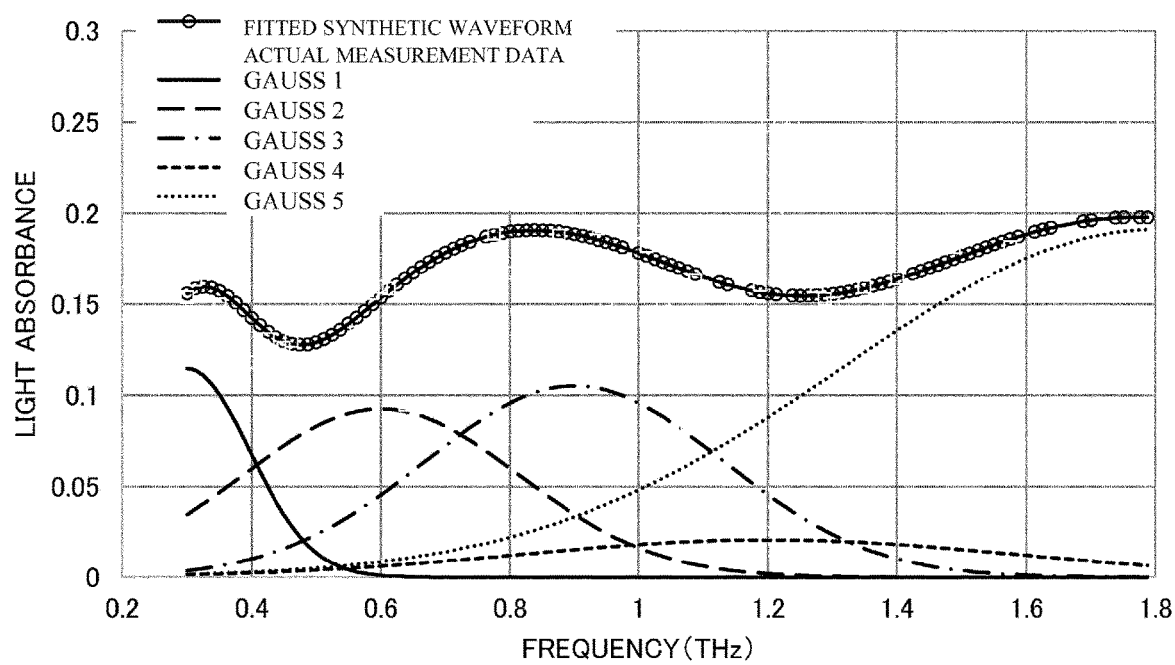
FIG. 7 is a diagram for describing processing content by a second fitting processing unit according to the first embodiment.

FIG. 7 is a waveform diagram illustrating processing content by the second fitting processing unit 13C. Note that, similarly to FIG. 5, FIG. 7 illustrates an example of a state in which the fitting is performed on the frequency spectrum of one sample. FIG. 7 illustrates an example in which five center frequencies of 0.3 THz from the group Gr1, 0.6 THz from the group Gr2, 0.9 THz and 1.2 THz at equal intervals from the group Gr3, and 1.8 THz from the group Gr4 are specified by the center frequency specifying unit 13B. Regarding the group Gr4, since the frequency range is fairly wide, and a plurality of center frequencies are widely distributed, only one center frequency is specified as a representative since noise is likely to be included.

As illustrated in FIG. 7, the second fitting processing unit 13C performs the optimization calculation so that the residual error between the value of the light absorbance at each frequency of the frequency spectrum and the value at each frequency on the synthetic waveforms of the n normal distribution functions (Gausses 1 to 5) which are variably set using the amplitude and the width as parameters.

The graph generating unit 14 generates a graph different from the frequency spectrum using at least one of the center frequency, the amplitude, and the width of the n normal distribution functions used for the fitting by the second fitting processing unit 13C. For example, the graph generating unit 14 calculates an area of a predetermined region of the normal distribution waveform (a waveform region having an amplitude of a 1/e or more width) from the amplitude and the 1/e width at the center frequency for every n normal distribution functions and generates a graph indicating a relation between the center frequency and the area. This graph can be regarded as being generated using all of the center frequency, the amplitude, and the width of the normal distribution function.

Figure 8:
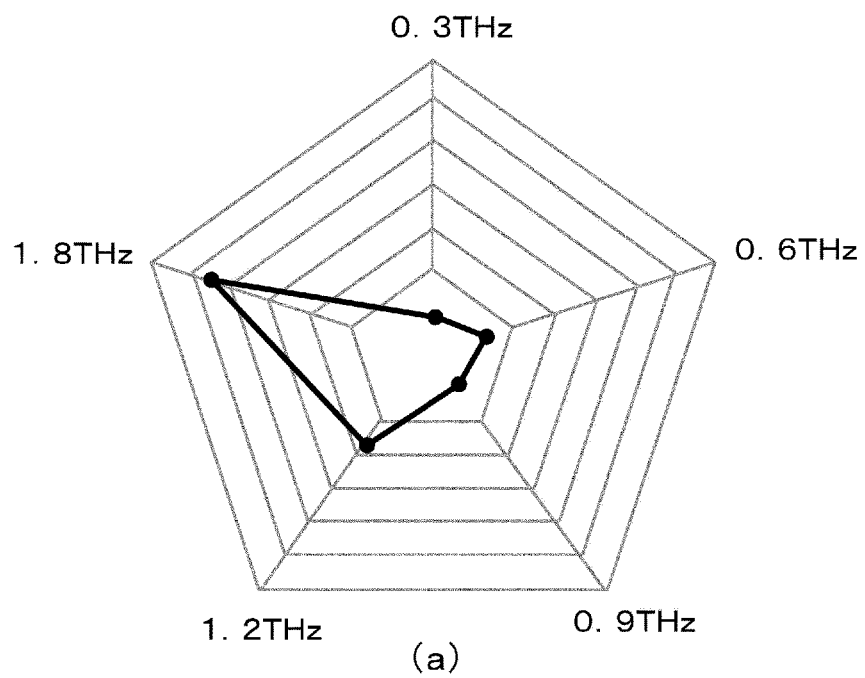
FIG. 8 is a diagram illustrating an example of a graph generated by a graph generating unit according to the first embodiment.
Figure 8:
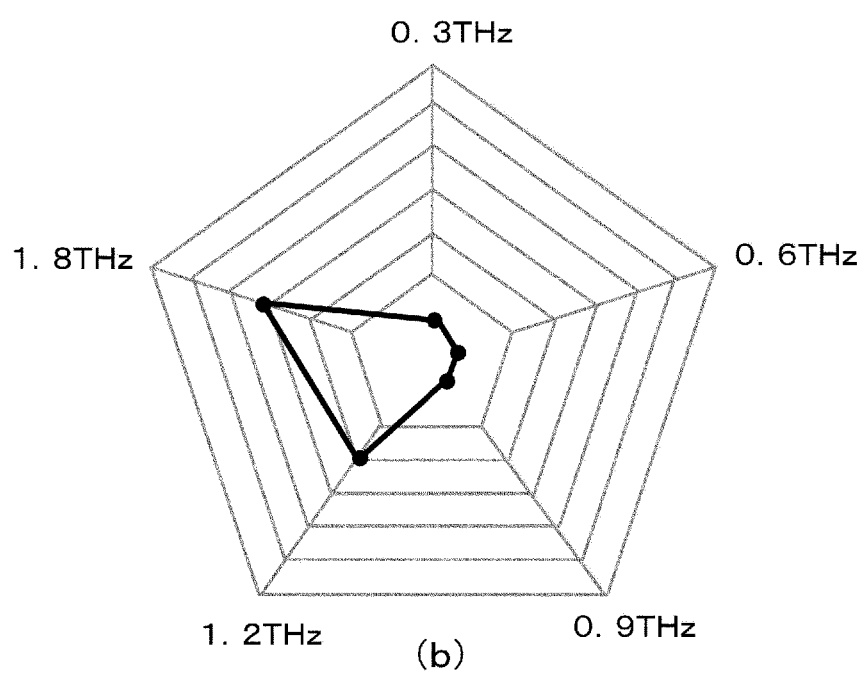

More specifically, as illustrated in FIG. 8, the graph generating unit 14 generates a radar graph in which the n center frequencies are set as n axes, and an area is indicated as a value of each axis. A radar graph of FIG. 8 illustrates an example of a graph generated when the center frequency specifying unit 13B specifies five center frequencies of 0.3 THz, 0.6 THz, 0.9 THz, 1.2 THz, and 1.8 THz.

A radar graph illustrated in FIG. 8(a) is generated from a terahertz wave signal related to one sample. A radar graph illustrated in FIG. 8(b) is generated from a terahertz wave signal related to another sample. As described above, the graph generated by the graph generating unit 14 is a graph in which the difference in the characteristic of the sample is reflected, and the difference in the characteristic clearly appears as the difference in a shape of the graph. Accordingly, it is possible to visualize the feature corresponding to the characteristic of the sample in the form of a graph in an easy-to-understand manner. For example, it is also possible to objectively visualize the feature of the sample which can be sensed only by human senses in the past as the shape of the radar graph.

Figure 9:
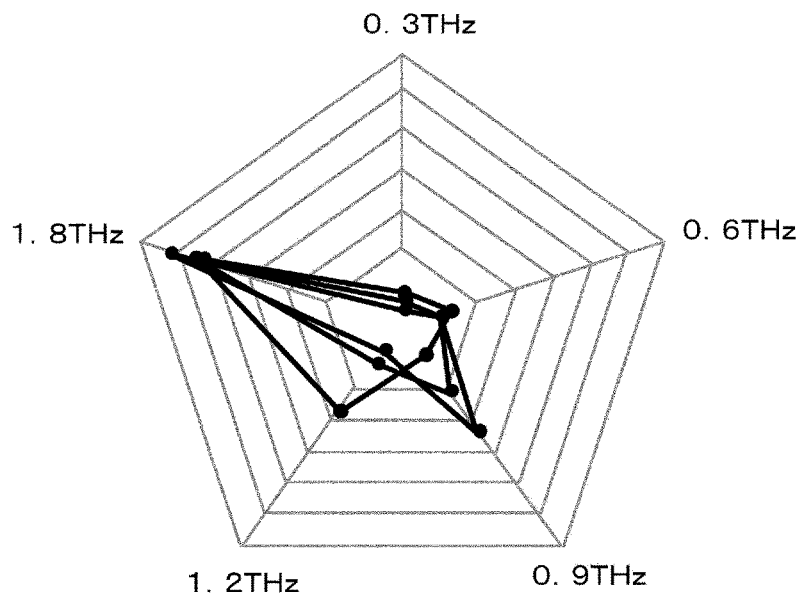
FIG. 9 is a diagram illustrating another example of the graph generated by the graph generating unit according to the first embodiment.

Note that, a plurality of radar graphs generated from a plurality of terahertz wave signals may be overlapped and visualized. FIG. 9 is a diagram illustrating an example. In the example illustrated in FIG. 9, an aqueous solution in which 10% of ethanol is mixed with pure water is used as a sample, and for each of the sample after 30 minutes after mixing, the sample after 60 minutes after mixing, and the sample after 24 hours after mixing, the radar graph is generated, overlapped, and visualized. In this example, how the characteristic of the aqueous solution change is visualized as the mixing degree of ethanol progresses.

In the example in FIG. 9, the state change of one sample (aqueous ethanol solution) accompanying with the passage of time is indicated by a plurality of radar graphs, but a plurality of radar graphs generated from a plurality of samples are overlapped and visualized. In this case, if a plurality of samples have the same characteristic, a plurality of generated radar graphs overlap as the substantially same shape. On the other hand, if a plurality of samples have different characteristics, the generated radar graphs have different shapes.

Accordingly, since the radar graphs are generated for a plurality of samples whose characteristic are unknown, it is possible to easily determine whether the samples have the same characteristic or different characteristic. Further, it is possible to easily identify a sample having the same characteristic as the known characteristic by generating a radar graph from each of a sample whose characteristic are known and a plurality of samples whose characteristic is unknown.

Figure 10:
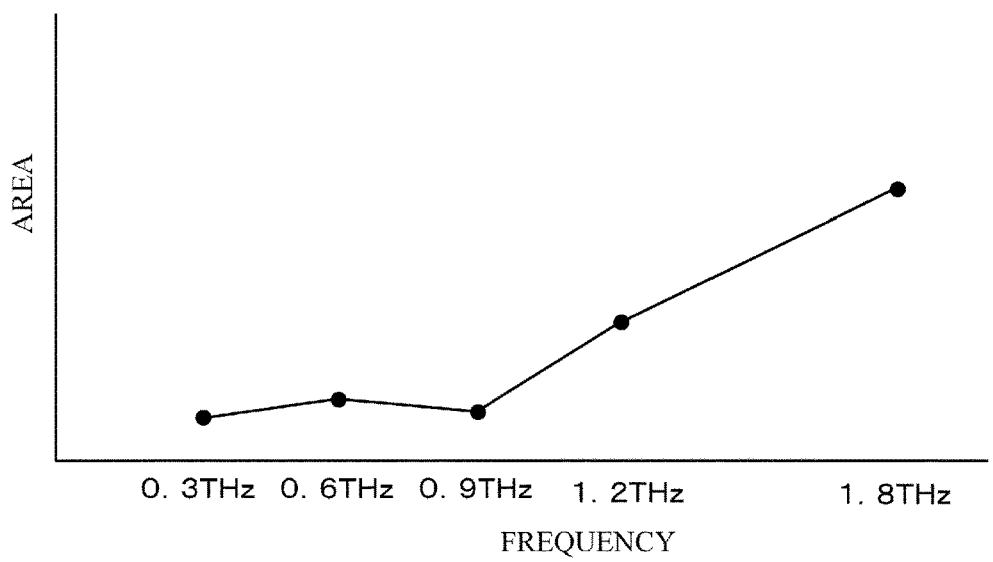
FIG. 10 is a diagram illustrating another example of the graph generated by the graph generating unit according to the first embodiment.

Note that, the form of the generated graph is not limited to the radar graph. For example, as illustrated in FIG. 10, the relation between the center frequency and the area may be generated as a line graph in which a horizontal axis indicates a center frequency, and a vertical axis indicates an area. Also, instead of the line graph, a bar, a scatter graph, or the like may be generated.

Also, here, the example in which the area is calculated from the amplitude and the width, and the graph indicating the relation between the center frequency and the area is generated, but the present invention is not limited thereto. For example, a bubble graph in which a vertical axis indicates an amplitude, a horizontal axis indicates a width, and the center frequency is indicated by a size of a circle may be generated.

Also, a graph may be generated using two of the center frequency, the amplitude, and the width. For example, the graph (a radar graph, a line graph, a bar graph, a scatter graph, or the like) indicating the relation between the amplitude and the width may be generated without including the center frequency as an element of the graph since the center frequency is common to all of the n normal distribution functions. Alternatively, the size of the amplitude of each center frequency or the size of the width of each center frequency may be generated by a circle graph.

Figure 11:
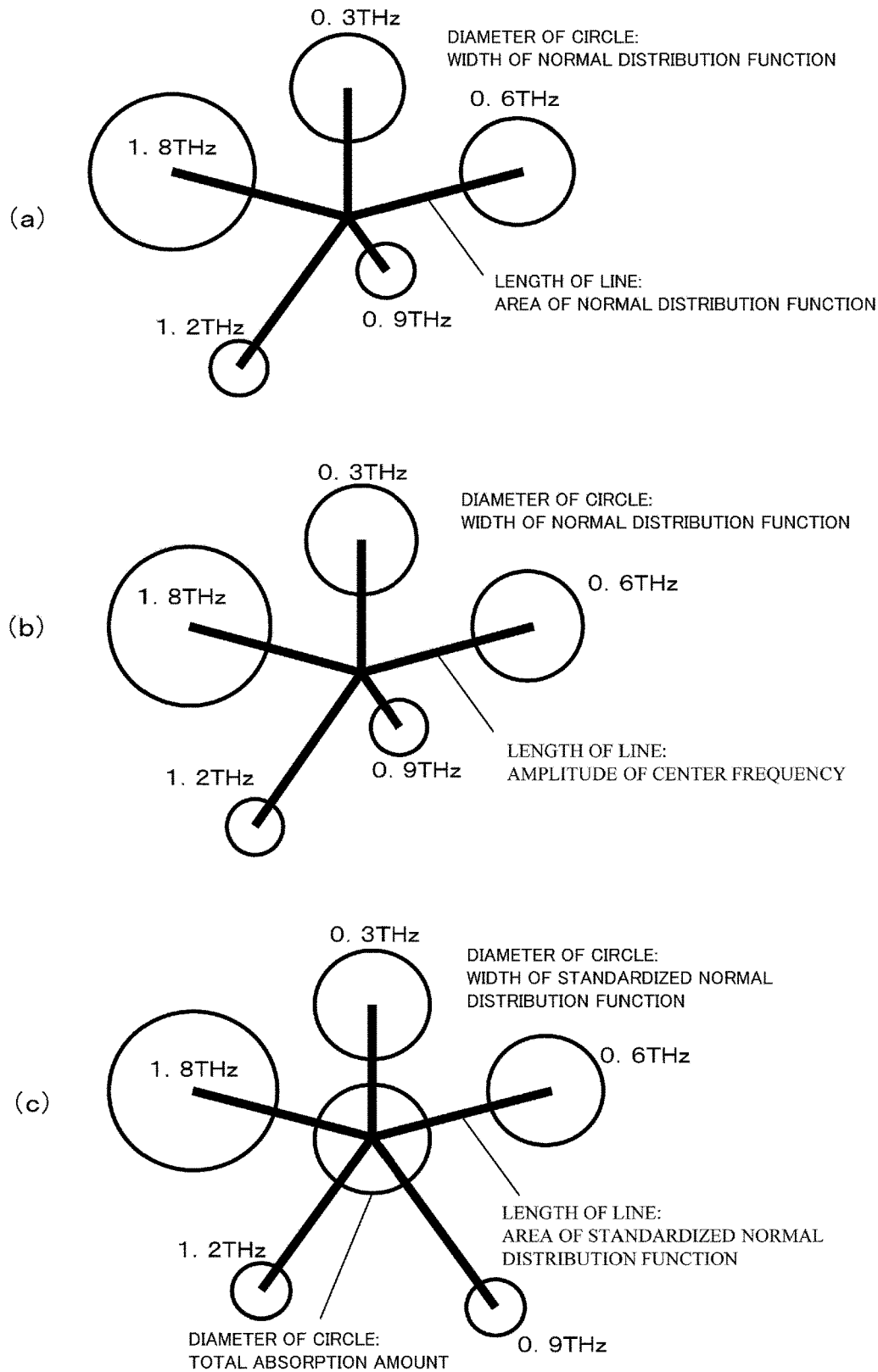
FIG. 11 is a diagram illustrating another example of the graph generated by the graph generating unit according to the first embodiment.

Alternatively, a graph illustrated in FIG. 11 may be generated. In FIG. 11(a), the n center frequencies are set as n axes, the area of the normal distribution function is indicated by the length of each axis, and the width of the normal distribution function (the 1/e width or the like) is indicated by the size of the circle drawn at the distal end of the axis. In FIG. 11(b), then center frequencies are set as n axes, the amplitude at the center frequency is indicated by the length of each axis, and the width of the normal distribution function (the 1/e width or the like) is indicated by the size of the circle drawn at the distal end of the axis. In FIG. 11(c), the n center frequencies are set as n axes, a total absorption amount is indicated by the size of the circle drawn at an intersection of respective axes (origin position), an area of a normalized normal distribution function is indicated by the length of each axis, and a width of the normalized normal distribution function is indicated by the size of the circle drawn at the distal end of the axis.

Figure 12:
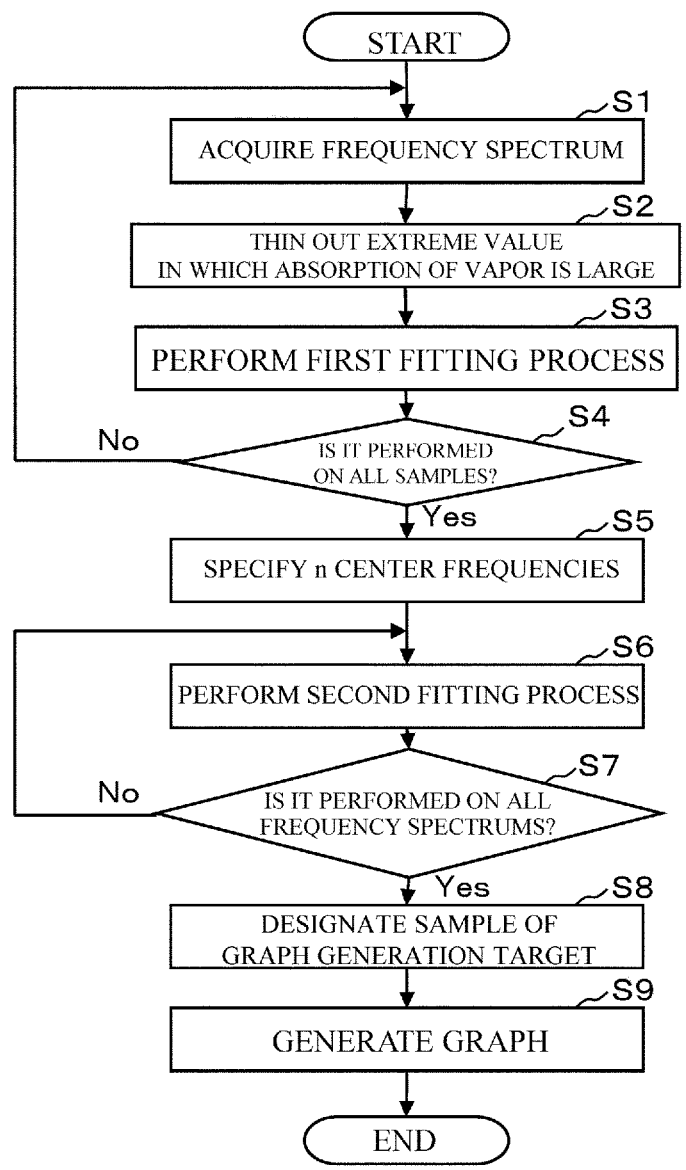
FIG. 12 is a flowchart illustrating an operation example of a terahertz wave signal analysis device according to the first embodiment.

FIG. 12 is a flowchart illustrating an operation example of the terahertz wave signal analysis device 101 according to the first embodiment having the above configuration. First, the frequency spectrum acquiring unit 11 acquires the frequency spectrum indicating the light absorbance for the frequency on the basis of the terahertz wave signal detected by the spectral device 20 for one sample (step S1).

Then, the thinning processing unit 12 thins out the extreme value at the frequency in which the absorption of the terahertz wave is increased by vapor among light absorbance data for each frequency in the frequency spectrum obtained by the frequency spectrum acquiring unit 11 using the data of the radio wave attenuation factor of NICT (step S2).

Then, the first fitting processing unit 13A performs the optimization calculation using the center frequency, the amplitude, and the width of the normal distribution function as the parameters and performs fitting on the frequency spectrum acquired in step S1 with the synthetic waveforms of a plurality of normal distribution functions which differ in at least the center frequencies (step S3). Accordingly, a plurality of normal distribution functions of approximating the frequency spectrum most satisfactorily are obtained.

Here, the frequency spectrum acquiring unit 11 determines whether or not the processes of steps S1 to S3 have been performed on all of a plurality of samples serving as the analysis target (step S4). Here, a plurality of samples serving as the analysis target are a plurality of samples used when specifying the center frequency as illustrated in FIG. 6. When the processes of steps S1 to S3 have not been completed on any one of the samples, the process returns to step S1, and the processes of steps S1 to S3 are performed on the terahertz wave signal related to the next sample.

On the other hand, when the processes of steps S1 to S3 have been completed on all of a plurality of samples serving as the analysis target, the center frequency specifying unit 13B groups the center frequencies of a plurality of normal distribution functions used for a plurality of fittings in the loop process of steps S1 to S3 and specifies the representative center frequency from each group (step S5). Accordingly, the n center frequencies are specified.

Then, the second fitting processing unit 13C fixes the n center frequencies specified by the center frequency specifying unit 13B to one of a plurality of frequency spectrums acquired in step S1 by the loop process, performs the optimization calculation using the amplitude and the width as parameters, and perform fitting on the frequency spectrum again with the synthetic waveforms of the n normal distribution functions (step S6). Accordingly, the n normal distribution functions of approximating the frequency spectrum most satisfactorily are obtained.

Here, the second fitting processing unit 13C determines whether or not the second fitting process of step S6 has been performed on all of a plurality of frequency spectrums acquired in step S1 by the loop process (step S7). When the second fitting process has not been performed on any one of all the frequency spectrums, the process returns to step S6, and the second fitting process is performed on the frequency spectrum of the next sample.

On the other hand, when the second fitting process has been performed on all of a plurality of frequency spectrums, the graph generating unit 14 receives a user operation specifying any one sample (step S8). One or more samples may be designated. The graph generating unit 14 generates the graph using at least one of the center frequency, the amplitude, and the width of the n normal distribution functions used for the fitting by the second fitting processing unit 13C with respect to the sample specified in step S8 (step S9).

Note that, in the flowchart illustrated in FIG. 12, the example in which, after the second fitting process is performed on all of the frequency spectrums related to a plurality of samples, any one sample is designated as the graph generation target has been described, but the present invention is limited to thereto. For example, the second fitting process may be performed only on the frequency spectrum related to the designated sample after any one sample is designated as the graph generation target.

As described above in detail, in the first embodiment, the synthetic waveforms of a plurality of normal distribution functions which differ in at least one of the center frequency, the amplitude, and the width are fit to the frequency spectrum obtained from the terahertz wave signal, and the graph is generated using at least one of the center frequency, the amplitude, and the width of a plurality of normal distribution functions used for the fitting.

According to the first embodiment having the above configuration, the frequency spectrum which does not clearly appear because the difference in the characteristic of the sample becomes the feature of the waveform is approximated by the synthetic waveforms of a plurality of normal distribution functions in the form in which the characteristic of the sample is taken over, and the graph is generated on the basis of the parameters of a plurality of normal distribution functions used in the approximation. Since the feature of the normal distribution function can be indicated by the parameters such as center frequency, the amplitude, and the width, the graph generated on the basis of the parameters is a graph in which the feature corresponding to the characteristic of the sample is visualized in an easy-to-understand manner. Accordingly, according to the terahertz wave signal analysis device 101 of the present embodiment, it is possible to analyze the terahertz wave signal detected by the spectral device 20 and visualize the feature corresponding to the characteristic of the sample in an easy-to-understand manner.

Note that, in the first embodiment, the example in which the n center frequencies are specified after the first fitting process is performed on the frequency spectrum related to a plurality of samples has been described, but only the first fitting process may be performed. In this case, the graph generating unit 14 generates the graph using at least one of the center frequency, the amplitude, and the width of a plurality of normal distribution functions obtained by the optimization calculation by the first fitting processing unit 13A. In this case, since it is not necessary to specify the n center frequencies, the first fitting process need not necessarily be performed on the frequency spectrum related to a plurality of samples, and the first fitting may be performed on only one frequency spectrum whose characteristic is desired to be analyzed. Note that, it is desirable to perform the second fitting process as in the above-mentioned embodiment in suppressing noise. The above modification is also applicable to a second embodiment to be described later.

Also, in the first embodiment above, the normal distribution function (the Gaussian function) is used as an example of the function used for fitting, but it can also be realized using a Lorentz function. Further, a probability distribution functions such as a Poisson distribution function (a probability mass function or a cumulative distribution function) which is an asymmetric form which is not centrally symmetrical or a chi-square distribution function (a probability density function or a cumulative distribution function) may be used, or other functions having a mountain-like waveform shape may be used. When the probability distribution function is used, the fitting is performed using a value indicating a property of the probability distribution (for example, a median value or a mode value of the amplitude, a frequency at which the amplitude value can be obtained, a frequency width at which the amplitude is equal to or larger or smaller than a predetermined value, or the like) as the parameter. If the mountain-shaped function is used, the fitting is performed using a maximum amplitude serving as a vertex, a frequency at which the maximum amplitude can be obtained, a frequency width with which the amplitude is equal to or larger or smaller than a predetermined value, or the like as the parameter. The above modification is also applicable to the second embodiment to be described later.

In the first embodiment described above, the example in which the frequency spectrum indicating the light absorbance for the frequency is obtained using the light absorbance as the characteristic value of the terahertz wave signal has been described, but other characteristic values such as transmittance may be used. The above modification is also applicable to the second embodiment to be described later.

Second Embodiment

Figure 13:
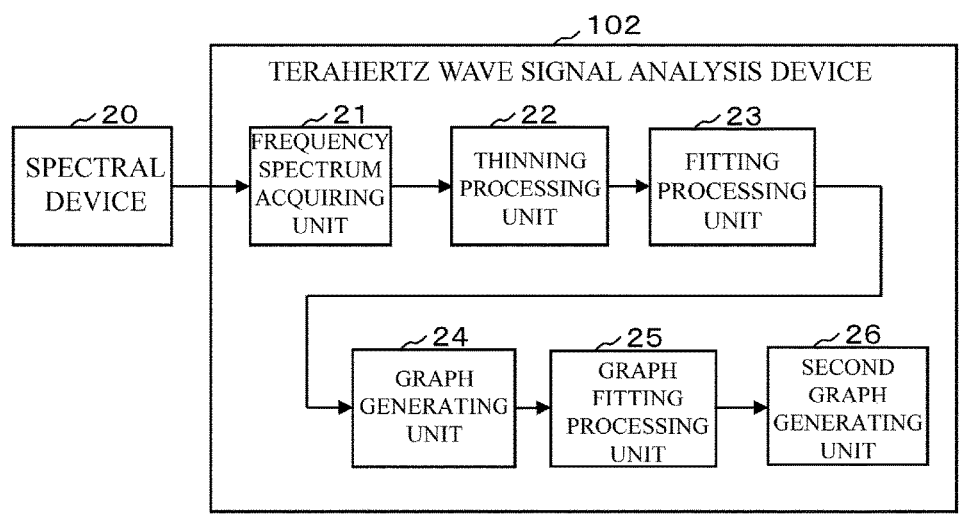
FIG. 13 is a block diagram illustrating an example of a functional configuration of a terahertz wave signal analysis device according to a second embodiment.

Below, the second embodiment of the present invention will be described on the basis of the drawings. FIG. 13 is a block diagram illustrating a functional configuration example of a terahertz wave signal analysis device 102 according to the second embodiment. The terahertz wave signal analysis device 102 according to the second embodiment analyzes the terahertz wave signal of the sample detected by the spectral device 20, and includes a frequency spectrum acquiring unit 21, a thinning processing unit 22, a fitting processing unit 23, a graph generating unit 24, a graph fitting processing unit 25 and a second graph generating unit 26 as its functional configuration.

Each of the above functional blocks 21 to 26 can be constituted by any of hardware, DSP, and software. For example, when constituted by software, each of the functional blocks 21 to 26 is actually configured to include a CPU, a RAM, a ROM, and the like of a computer and is realized as a terahertz wave signal analysis program stored in a recording medium such as a RAM, a ROM, a hard disk, or a semiconductor memory operates.

Similar to the frequency spectrum acquiring unit 11 described in the first embodiment, the frequency spectrum acquiring unit 21 obtains a frequency spectrum indicating light absorbance for a frequency on the basis of the terahertz wave signal detected by the spectral device 20. However, in the second embodiment, as the sample for detecting the terahertz wave in the spectral device 20, a plurality of predetermined substance-mixed aqueous solutions generated by changing the concentration of a predetermined substance having an amphiphilic molecule are used. In other words, the frequency spectrum acquiring unit 21 obtains the frequency spectrum for each concentration of a predetermined substance for a plurality of samples including of the predetermined substance-mixed aqueous solution on the basis of a plurality of terahertz wave signals respectively detected by the spectral device 20.

Here, the predetermined substance is, for example, a surfactant (also called an emulsifier). The surfactant has an amphiphilic molecule in which a hydrophilic group and a hydrophobic group are bonded. In the surfactant-mixed aqueous solution, amphiphilic molecules spontaneously form various aggregates such as micelles or vesicles which are spherical structures depending on a mixing ratio or a concentration. Because the micelles and the vesicles can enclose other molecules thereinside, they are expected to be applied to medical fields such as artificial blood and drug delivery in addition to familiar applications such as soap, cosmetics, or food fields.

The micelles and the vesicles formed in the solution by a plurality of amphiphilic molecules have a strong correlation with a binding state between molecules, and a direct observation technique is desired in order to accurately detect the mixed state of the solution. In a liquid chromatograph device which has been used frequently for analysis of liquid samples in the past, it is possible to analyze component molecules by isolating molecules in the solution in the mixed state, but a unique state created by a mixture of a plurality of molecules in the mixed state is unable to be detected. It is difficult to obtain appropriate information about weak aggregation of large molecules with infrared spectroscopy or NMR.

The micelles or the vesicles are molecular assemblies formed only by intermolecular interactions such as hydrophobic interactions, electrostatic interactions, and hydrogen bonds, and their state is easily changed by a disturbance factor. Although it is possible to extract a part of the solution and detect are changed shape with a microscope, it is difficult to observe more turbid concentrated solutions in real time. Therefore, since the state of the micelles or the vesicles is unable to be observed directly, research and development or manufacturing have been conducted depending on indirect observation means or experience. Accordingly, a behavior of transition between an amphiphilic molecule and a micelle or between a micelle and a vesicle which do not have a spherical structure is unable to be sufficiently detected at present.

As described above, in light of such an actual situation, the terahertz wave signal analysis device 102 according to the second embodiment is configured to be able to easily detect a micelle critical concentration indicating a behavior of transition between the amphiphilic molecule and the micelle and a vesicle critical concentration indicating a behavior of transition between the micelle and the vesicle. Note that, here, although the surfactant is here described as a predetermined substance having an amphiphilic molecule, the present invention is not limited to thereto. In other words, any substance having amphiphilic molecule capable of obtaining a state of a micelle or vesicle may be used.

Similarly to the thinning processing unit 12 described in the first embodiment, the thinning processing unit 22 performs the process of thinning out an extreme value at a frequency in which the absorption of the terahertz wave is increased by vapor other than the sample among light absorbance data for each frequency in the frequency spectrum obtained by the frequency spectrum acquiring unit 21. In particular, in the second embodiment, the thinning processing unit 22 separately performs the thinning process on each of a plurality of frequency spectrums obtained by the frequency spectrum acquiring unit 21 for each of a plurality of surfactant-mixed aqueous solutions which differ in a surfactant concentration.

Similarly to the fitting processing unit 13 described in the first embodiment, the fitting processing unit 23 performs the process of fitting the synthetic waveforms of a plurality of normal distribution functions which differ in at least one of the center frequency, the amplitude, and the width to the frequency spectrum obtained by the frequency spectrum acquiring unit 21. In particular, in the second embodiment, the fitting processing unit 23 executes the fitting process on a plurality of frequency spectrums obtained by the frequency spectrum acquiring unit 21 for every two or more surfactant-mixed aqueous solutions which differ in a surfactant concentration for each surfactant concentration.

In other words, the fitting processing unit 23 calculates a plurality of normal distribution functions that minimizes the residual error between the light absorbance data (a plurality of pieces of light absorbance data thinned out by the thinning processing unit 22) at each frequency of the frequency spectrum related to the surfactant-mixed aqueous solution of a certain concentration and the value of synthetic waveform at each frequency corresponding thereto through the optimization calculation using the center frequency, the amplitude, and the width as the variables. This is separately performed on frequency spectrums of a plurality of concentrations.

Figure 15:
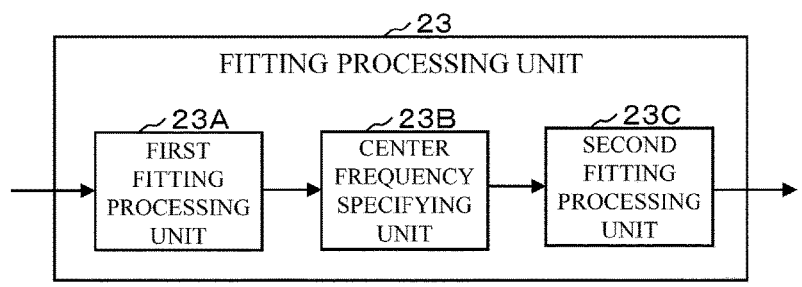
FIG. 15 is a diagram illustrating a specific functional configuration example of a fitting processing unit according to the second embodiment.

FIG. 15 is a block diagram illustrating an example of a specific functional configuration of the fitting processing unit 23. As illustrated in FIG. 15, the fitting processing unit 23 includes a first fitting processing unit 23A, a center frequency specifying unit 23B, and a second fitting processing unit 23C as a more specific functional configuration.

The first fitting processing unit 23A performs fitting on the frequency spectrum with the synthetic waveform of a plurality of normal distribution functions which differ in at least the center frequency using the center frequency, the amplitude, and the width as the parameters for each of a plurality of frequency spectrums obtained for a plurality of surfactant-mixed aqueous solutions generated by changing the concentration. This process is similar to that described with reference to FIG. 5.

The center frequency specifying unit 23B groups each center frequency of the normal distribution function used when the first fitting processing unit 23A performs the fitting on the frequency spectrums of a plurality of concentrations twice or more, and specifies the n center frequencies by specifying one or more representative center frequencies from each group.

The second fitting processing unit 23C fixes the n center frequencies specified by the center frequency specifying unit 23B to each of a plurality of frequency spectrums obtained for the surfactant-mixed aqueous solutions of a plurality of concentration and performs the fitting on the frequency spectrum again with the synthetic waveforms of the n normal distribution functions using the n normal distribution functions using the amplitude and the width as the parameters.

Similarly to the graph generating unit 14 described in the first embodiment, the graph generating unit 24 generates a graph different from the frequency spectrum using at least one value deciding the properties of a plurality of normal distribution functions used in the fitting. However, the second embodiment, the graph generating unit 24 calculates an area (corresponding to an index value in claims set forth therebelow) of a predetermined region of the normal distribution waveform (a waveform region having an amplitude of the 1/e or more width) from the amplitude and a predetermined width (for example, the 1/e width) in the center frequency of the normal distribution function for each surfactant concentration of a plurality of surfactant-mixed aqueous solutions used as the sample, and generates an explicit or implicit graph in which the surfactant concentration and the area are used as axes of two directions. In the present embodiment, since the n center frequencies are specified in the fitting processing unit 23, the graph in which the surfactant concentration and the area are used as axes of two directions is generated for each center frequency. This graph can be regarded as a graph generated using the amplitude and a predetermined width in the center frequency of the normal distribution function and further the surfactant concentration.

Here, the explicit graph means a graph that is visualized in a state that can be visually confirmed by humans. Further, the implicit graph means a graph generated as an internal process by a computer and need not necessarily be visible in a state that can be visually confirmed by humans. Note that, here, the graph generating unit 24 is described as a unit that generates an explicit graph.

Figure 14:
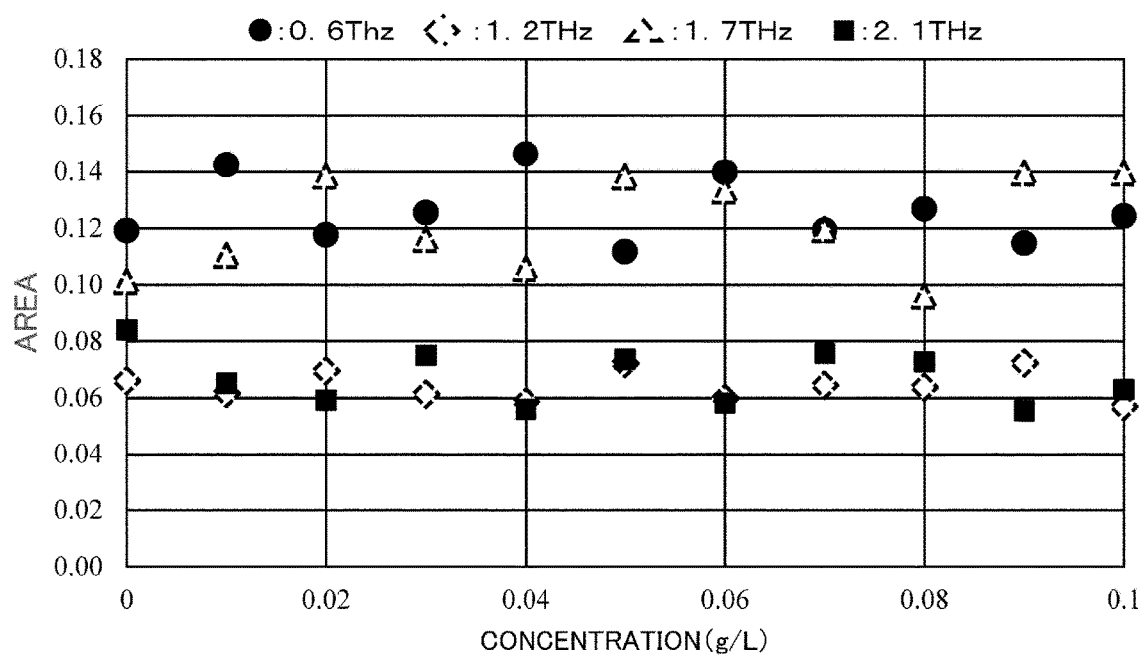
FIG. 14 is a diagram illustrating an example of a graph generated by a graph generating unit according to the second embodiment.

FIG. 14 is a diagram illustrating an example of a graph generated by the graph generating unit 24. The graph illustrated in FIG. 14 is a graph which plots the value of each area for each concentration using the surfactant concentration and the area calculated from the amplitude and the 1/e width in the center frequency of the normal distribution function as the horizontal axis and the vertical axis, respectively. Here, an example of a graph generated when four center frequencies, that is, 0.6 THz, 1.2 THz, 1.7 THz, and 2.1 THz are specified by the fitting processing unit 23 is illustrated.

The example of FIG. 14 illustrates analysis results of terahertz wave signals respectively detected from surfactant-mixed aqueous solutions of 11 concentrations of 0 to 0.1 [g/L] in units of 0.01 [g/L] by the spectral device 20. In other words, FIG. 14 illustrates a graph which plots the value of each area for each concentration on a coordinate plane having the 11 concentrations and the area as the horizontal axis and the vertical axis, respectively.

The graph fitting processing unit 25 divides the graph generated by the graph generating unit 24 into a plurality of regions in an axial direction of concentration. Then, the graph fitting processing unit 25 fits a value of a predetermined graph fitting function indicating a relation between the concentration and the area to the value of each area for each concentration included in the region for each divided region. At this time, the graph fitting processing unit 25 performs the fitting process by calculating the optimization calculation of minimizing the residual error between the value of each area for each concentration and the value of the graph fitting function using the concentration of the boundary that divides the region and the coefficient of the graph fitting function as the variables.

For example, the graph fitting processing unit 25 divides the graph generated by the graph generating unit 24 into two regions into an axial direction of concentration. Then, the graph fitting processing unit 25 fits a value of a predetermined graph fitting function to the value of each area for each concentration included in the region for every two divided regions (hereinafter, respective regions are referred to as a low concentration region and a high concentration region).

In the present embodiment, for example, a quadratic function indicated by the following Formula 1 is used as a predetermined graph fitting function. However, the present invention is not limited to thereto.

$$S_i(x)=a_ix^2+b_ix+c_i(i=1,2) \quad \text{(Formula 1)}$$

Here, i indicates a number of the divided region, i=1 corresponds to the low concentration region, and i=2 corresponds to the high concentration region. x indicates the surfactant concentration, $S_i(x)$ indicates an area equivalent value calculated for the concentration x included in an i-th region, $a_i$, $b_i$, and $c_i$ indicate coefficients of the i-th graph fitting function.

The graph fitting processing unit 25 performs the optimization calculation of minimizing the residual error between the value of each area for each concentration x (the value plotted on the graph) and the value of the graph fitting function $S_i(x)$ for each concentration x using a concentration D of a boundary dividing the region (an arbitrary value of 0<D<0.1 [g/L]. Hereinafter referred to as a boundary concentration D) and the coefficient $a_i$, $b_i$, and $c_i$ of the graph fitting function $S_i(x)$ in the two regions divided by the boundary concentration D as the variables.

For example, if the boundary concentration D is 0.04 [g/L], five concentrations x of 0, 0.01, 0.02. 0.03, and 0.04

[g/L] are included in the low concentration region, and six concentrations x of 0.05, 0.06, 0.07, 0.08, 0.09, and 0.1 [g/L] are included in the high concentration region. In this case, the graph fitting processing unit 25 fits the value of the graph fitting function $S_1(x)$ of the low concentration region to the value of each area (the value which is the value of the area obtained as a result of analyzing the concentration x of the surfactant-mixed aqueous solution and plotted on the graph) for the five concentrations x (0 to 0.04 [g/L] included in the low concentration region using the coefficient $a_1$, $b_1$, and $c_1$ of the graph fitting function $S_1(x)$ of the low concentration region as the variables. In other words, the coefficients that minimize the residual error between the value of each area (the values plotted on the graph) for the five concentrations x included in the low concentration region and the value of the graph fitting function $S_1(x)$ for each concentration x are obtained as $a_1$, $b_1$, and $c_1$.

Similarly, the graph fitting processing unit 25 fits the value of the graph fitting function $S_2(x)$ of the high concentration region to the value of each are (the value plotted on the graph) for the six concentrations x (0.05 to 0.1 [g/L]) included in the high concentration region using the coefficients $a_2$, $b_2$, and $c_2$ of the graph fitting function $S_2(x)$ of the high concentration region as the variables. In other words, the coefficients that minimize the residual error between the value of each area (the values plotted on the graph) for the six concentrations x included in the high concentration region and the value of the graph fitting function $S_2(x)$ for each concentration x are obtained as $a_2$, $b_2$, and $c_2$.

Further, the graph fitting processing unit 25 calculates a sum of the residual error minimized in the low concentration region and the residual error minimized in the high concentration region. The graph fitting processing unit 25 performs the optimization calculation using the boundary concentration D as a variable and obtains the boundary concentration D in which the sum of the residual error of the low concentration region and the residual error of the high concentration region becomes minimum. The boundary concentration D calculated by the optimization calculation and the coefficients $a_i$, $b_i$, and $c_i$ of the graph fitting function $S_i(x)$ in each region divided into two in the boundary concentration D are output of the graph fitting processing unit 25.

The second graph generating unit 26 generates a graph indicated by the graph fitting function $S_i(x)$ in the two regions (the low concentration region and high concentration region) divided by the boundary concentration D in accordance with the boundary concentration D obtained by the optimization calculation of the graph fitting processing unit 25 and the coefficients $a_i$, $b_i$, and $c_i$ of the graph fitting function $S_i(x)$.

Figure 16:
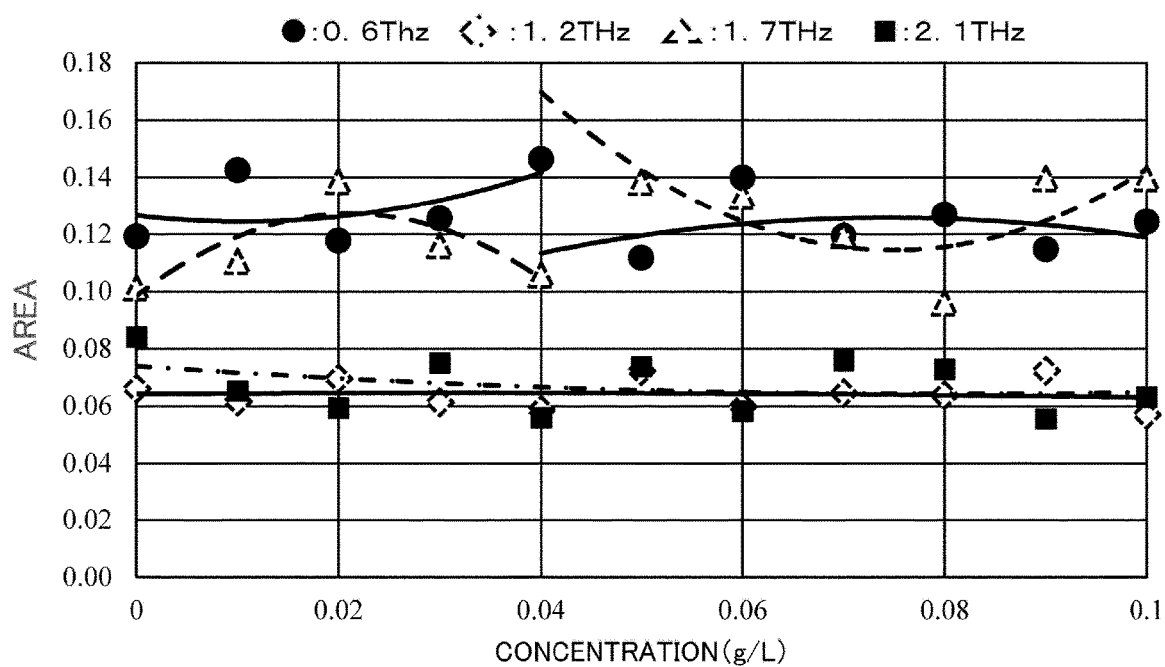
FIG. 16 is a diagram illustrating an example of a graph generated by a second graph generating unit according to the second embodiment.

FIG. 16 is a diagram illustrating an example of a graph generated by the second graph generating unit 26. The graph illustrated in FIG. 16 is a graph in which curved lines indicated by the two graph fitting functions $S_i(x)$ are illustrated on the left and the right using the boundary concentration D calculated by the graph fitting processing unit 25 as a boundary on the basis of the value of each plot illustrated in FIG. 14 in the coordinate plane having the surfactant concentration and the area calculated from the amplitude and the 1/e width in the center frequency of the normal distribution function as the horizontal axis and the vertical axis, respectively.

FIG. 16 illustrates a graph in which the graph fitting processing unit 25 obtains 0.04 [g/L] as the boundary concentration D that minimizes the residual error. Also, in the example of FIG. 16, similarly to FIG. 14, the curved line of the graph fitting function $S_i(x)$ is illustrated for each of a plurality of center frequencies (0.6 THz, 1.2 THz, 1.7 THz, and 2.1 THz) specified by the fitting processing unit 23.

Here, in the case of the curved line drawn for 1.2 THz and the curved line drawn for 2.1 THz, the values of the two graph fitting functions $S_1(x)$ and $S_2(x)$ at the boundary concentration D (0.04 [g/L]) are equal, and the curved line of the graph fitting function $S_1(x)$ of the low concentration region and the curved line of the graph fitting function $S_2(x)$ of the high concentration region are continuous.

On the other hand, in the case of the curved line drawn for 0.6 THz and the curved line drawn for 1.7 THz, the values of the two graph fitting functions $S_1(x)$ and $S_2(x)$ at the boundary concentration D are understood to deviate by a predetermined value or more. In other words, in the case of the curved lines of the two graph fitting functions $S_1(x)$ and $S_2(x)$ drawn for 0.6 THz, a difference between a value of a graph fitting function $S_1(D)$ in the low concentration region at the boundary concentration D and a value of the graph fitting function $S_2(D)$ in the high concentration region at the boundary concentration D is about 0.03, and the curved line of the graph fitting function $S_1(x)$ of the low concentration region and the curved line of the graph fitting function $S_2(x)$ of the high concentration region are discontinuous.

Also, in the case of the curved lines of the two graph fitting functions $S_1(x)$ and $S_2(x)$ drawn for 1.7 THz, a difference between a value of a graph fitting function $S_1(D)$ in the low concentration region at the boundary concentration D and a value of the graph fitting function $S_2(D)$ in the high concentration region at the boundary concentration D is about 0.06, and the curved line of the graph fitting function $S_1(x)$ of the low concentration region and the curved line of the graph fitting function $S_2(x)$ of the high concentration region are discontinuous.

When the values of the two graph fitting functions $S_1(x)$ and $S_2(x)$ at the boundary concentration D deviate by a predetermined value or more (or the two graph fitting functions $S_1(x)$ and $S_2(x)$ are discontinuous) as described above, it can be regarded as indicating that the property of the surfactant-mixed aqueous solution at the boundary concentration D is rapidly changing on the low concentration region side and the high concentration region side. Therefore, the boundary concentration D having such a property can be regarded as indicating a critical concentration of the surfactant-mixed aqueous solution. In the present embodiment, since the concentrations of 0 to 0.1 [g/L] are divided into two regions and analyzed, the boundary concentration D can be regarded as being the micelle critical concentration indicating the behavior of the transition between the amphiphilic molecule and the micelle.

Note that, in the case that the surfactant concentration is divided into three regions and analysis is performed and two boundary concentration $D_1$ and $D_2$ ($D_1<D_2$) are calculated, when the values of two graph fitting function $S_2(x)$ and $S_3(x)$ in boundary concentration $D_2$ deviate by a predetermined value or more (or when two graph fitting functions $S_2(x)$, $S_3(x)$ are discontinuous), it can be inferred that their boundary concentration $D_2$ is a vesicle critical concentration indicating the behavior of the transition between micelles and vesicles.

Therefore, if the graph generated by the second graph generating unit 26 is visualized as an explicit graph (for example, the graph is displayed on a display), it is possible to easily understand the micelle critical concentration or the vesicle critical concentration of the surfactant-mixed aqueous solution by viewing the graph.

Note that, there are cases in which it is clearly interpreted that the property of graph is different between the low concentration region side and the high concentration region side using a certain concentration as a boundary on the basis of only the graph of FIG. 14 generated by the graph generating unit 24. Therefore, the graph generated by the graph generating unit 24 may be generated as an explicit graph without installing the graph fitting processing unit 25 and the second graph generating unit 26. In this case, when a line graph in which plots are connected by lines is generated and visualized instead of the graph which simply plots the values as illustrated in FIG. 14, it is possible to easily determine whether or not the property of graph is different between the low concentration region side and the high concentration region side. However, it is desirable to install the graph fitting processing unit 25 and the second graph generating unit 26 because the presence or absence of critical concentration is easily determined when graph fitting results are visualized and displayed as illustrated in FIG. 16.

Figure 17:
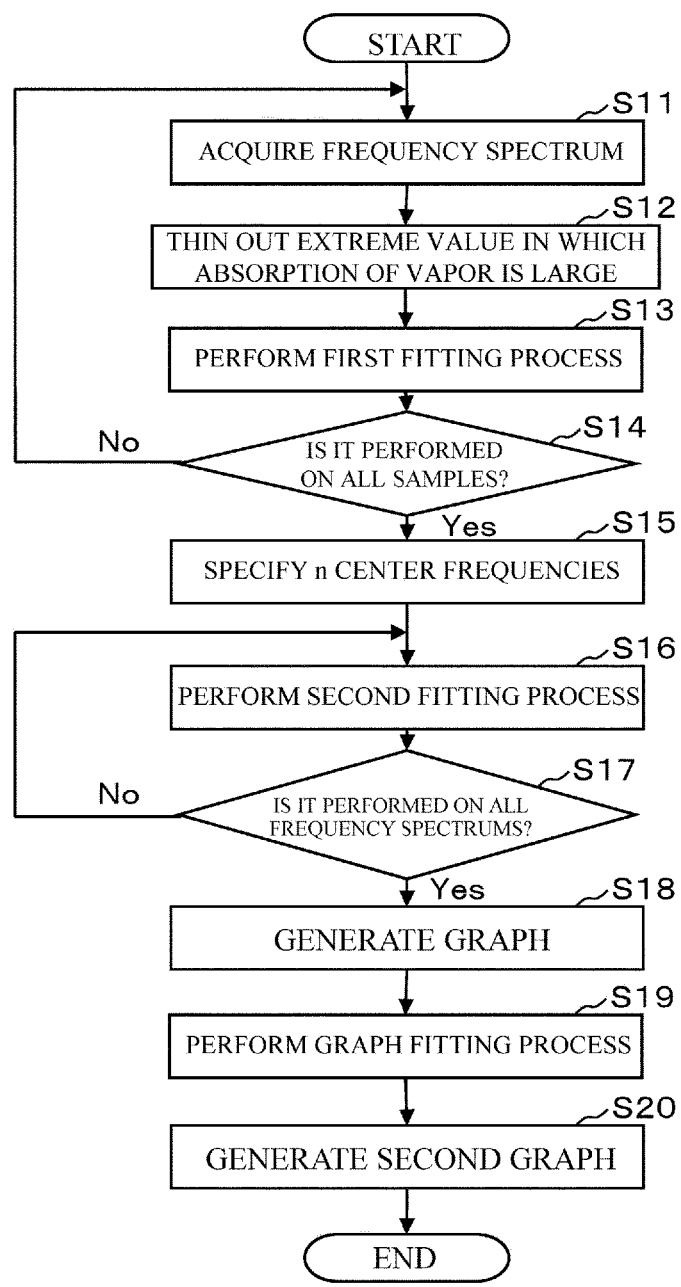
FIG. 17 is a flowchart illustrating an operation example of the terahertz wave signal analysis device according to the second embodiment.

FIG. 17 is a flowchart illustrating an operation example of the terahertz wave signal analysis device 102 according to the second embodiment having the above configuration. First, the frequency spectrum acquiring unit 21 uses the surfactant-mixed aqueous solution with a surfactant of a certain concentration as a sample and acquires the frequency spectrum indicating the light absorbance for the frequency on the basis of the terahertz wave signal detected by the spectral device 20 for the sample (step S11).

Then, the thinning processing unit 22 thins out the extreme value in the frequency in which the absorption of the terahertz wave is increased by vapor among the light absorbance data for each frequency in the frequency spectrum obtained by frequency spectrum acquiring unit 21 using data of the radio wave attenuation factor of NICT (step S12).

Then, the fitting processing unit 23 (the first fitting processing unit 23A) performs the optimization calculation using the center frequency, the amplitude, and the width of the normal distribution function as the parameters and performs fitting on the frequency spectrum acquired in step S11 with the synthetic waveforms of a plurality of normal distribution functions which differs in at least the center frequency (step S13). Accordingly, a plurality of normal distribution functions of approximating the frequency spectrum most satisfactorily are obtained.

Here, the frequency spectrum acquiring unit 21 determines whether or not the processes of steps S11 to S13 have been performed on all of a plurality of samples serving as the analysis target (step S14). Here, a plurality of samples serving as the analysis target refer to a plurality of surfactant-mixed aqueous solutions that differ in a surfactant concentration. When the processes of steps S11 to S13 have not been completed on any one of all the samples, the process returns to step S11, and the processes of steps S11 to S13 are performed on the terahertz wave signal related to the next sample in which the surfactant concentration is changed.

On the other hand, when the processes of steps S11 to S13 have been completed on all of a plurality of samples serving as the analysis target, the fitting processing unit 23 (the center frequency specifying unit 23B) groups the center frequencies of a plurality of normal distribution functions used for a plurality of fittings in the loop process of steps S11 to S13 and specifies the representative center frequency from each group (step S15). Accordingly, the n center frequencies are specified.

Next, the fitting processing unit 23 (the second fitting processing unit 23C) fixes the n center frequencies specified by the center frequency specifying unit 23B to one of a plurality of frequency spectrums acquired in step S11 by the loop process, performs the optimization calculation using the amplitude and the width as the parameters, and then performs the fitting on the frequency spectrum again with the synthetic waveforms of the n normal distribution functions (step S16). Accordingly, the n normal distribution functions of approximating the frequency spectrum most satisfactorily are obtained.

Here, the second fitting processing unit 23C determines whether or not the second fitting process has been performed on all of a plurality of frequency spectrums acquired in step S11 by the loop process in step S16 (step S17). When the second fitting process has not been completed on any one of all the frequency spectrums, the process returns to step S16, and the second fitting process is performed on the frequency spectrum of the next sample.

On the other hand, when the second fitting process has been performed on all of a plurality of frequency spectrums, the graph generating unit 24 calculates an area of a predetermined region of the normal distribution waveform (a waveform region having an amplitude of the 1/e or more width) from the amplitude and a predetermined width (for example, the 1/e width) in the center frequency of the normal distribution function for each surfactant concentration and generates the graph of FIG. 14 in which the surfactant concentration and the area are used as axes of two directions (step S18).

Further, the graph fitting processing unit 25 divides the graph generated by the graph generating unit 24 into two regions using the boundary concentration D as a boundary and fits the value of the graph fitting function $S_i(x)$ indicated by Formula 1 described above to the value of each area for each concentration included in the region (the value plotted on the graph of FIG. 14) for each divided region. At this time, the graph fitting processing unit 25 performs the optimization calculation of minimizing the residual error using the boundary concentration D and the coefficient $a_i$, $b_i$, and $c_i$ of the graph fitting function $S_i(x)$ as the variables and calculates the boundary concentration D and the coefficient $a_i$, $b_i$, and $c_i$ of the graph fitting function $S_i(x)$ which are optimized (step S19).

Then, the second graph generating unit 26 generates a graph indicated by the graph fitting function $S_i(x)$ in the two regions (the low concentration region and high concentration region) divided by the boundary concentration D in accordance with the boundary concentration D obtained by the optimization calculation of the graph fitting processing unit 25 and the coefficients $a_i$, $b_i$, and $c_i$ of the graph fitting function $S_i(x)$ (step S20). Accordingly, the process of the flowchart illustrated in FIG. 17 ends.

As described above in detail, in the second embodiment, an area of a predetermined region in the waveform of the normal distribution function used in the fitting processing unit 23 is calculated for each surfactant concentration contained in the surfactant-mixed aqueous solution used as the sample, and the graph (see FIG. 14) in which the surfactant concentration and the area are used as axes of two directions. Since this graph is visualized and displayed, it is possible to visually confirm whether or not the property of the graph differs between the low concentration region side and the high concentration region side using a certain concentration as a boundary and detect a concentration of a part in which the property changes rapidly as the critical concentration of the surfactant-mixed aqueous solution.

In the second embodiment, the graph fitting process by the graph fitting processing unit 25 is performed on the graph generated by the graph generating unit 24, and the graph fitting function $S_i(x)$ fit to the optimized boundary concentration D and the value of each plot position on the graph generated by the graph generating unit 24 on each of the low concentration region side and the high concentration region side is obtained. Then, the second graph generating unit 26 generates the graph of the graph fitting function $S_i(x)$ on the low concentration region side and the high concentration region side using the boundary concentration D as a boundary. Since this graph is visualized and displayed, it is possible to easily determine whether or not the property of the graph differs between the low concentration region side and the high concentration region side using the boundary concentration D as a boundary and more easily detect the critical concentration of the surfactant-mixed aqueous solution.

Figure 18:
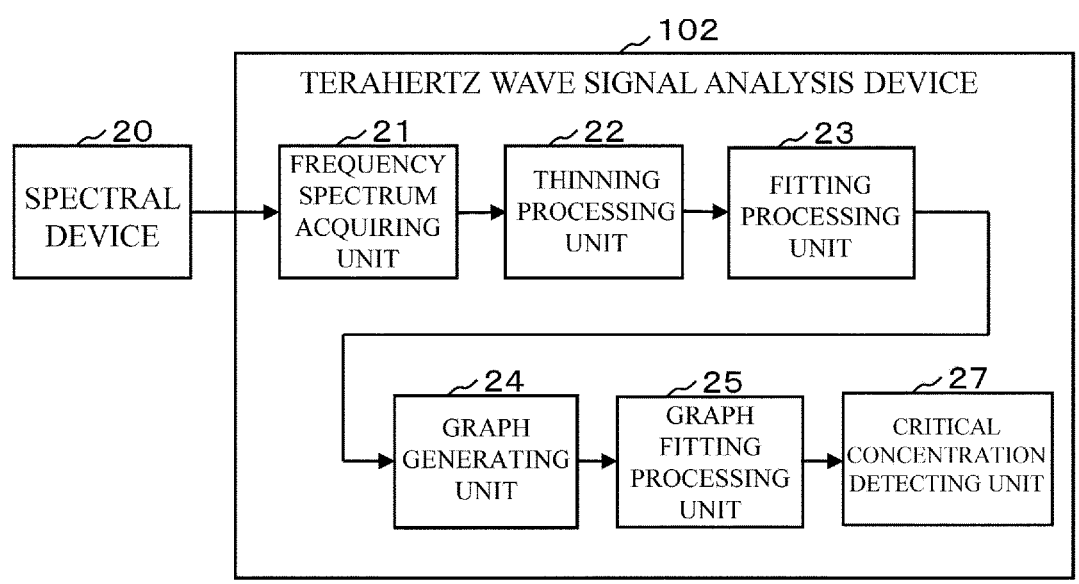
FIG. 18 is a block diagram illustrating another functional configuration example of the terahertz wave signal analysis device according to the second embodiment.

Note that, in the second embodiment described above, the example of generating the graph of the graph fitting function $S_i(x)$ by the second graph generating unit 26 has been described, but the present invention is not limited to thereto. For example, as illustrated in FIG. 18, a critical concentration detecting unit 27 may be installed instead of the second graph generating unit 26.

The critical concentration detecting unit 27 calculates the value of the graph fitting function $S_i(x)$ for the boundary concentration D obtained by the optimization calculation for each of the graph fitting function $S_i(x)$ in a plurality of regions in accordance with the coefficients $a_i$, $b_i$, and $c_i$ of the graph fitting function $S_i(x)$ in a plurality of regions obtained by the optimization calculation of the graph fitting processing unit 25. Then, it is determined whether or not each calculated value deviates by a predetermined value or more, and when each calculated value deviates by a predetermined value or more, the boundary concentration D is detected as the critical concentration.

Accordingly, the terahertz wave signal analysis device 102 can detect the critical concentration and present the result to the user without the user visually checking the graph. Note that, when the critical concentration detecting unit 27 is installed instead of the second graph generating unit 26, the graph generated by the graph generating unit 24 may be an implicit graph.

In the second embodiment, the example in which the graph generating unit 24 uses the area calculated from the amplitude and the 1/e width at the center frequencies of a plurality of normal distribution functions used for the fitting by the fitting processing unit 23 as the index value and generates the graph in which the index value and the surfactant concentration are used as axes of two directions has been described, but the present invention is not limited to thereto. For example, the graph generating unit 24 may uses either the amplitude and a predetermined width at the center frequency as the index value and generates a graph in which the index value and the surfactant concentration are used as axes of two directions. In this case, the graph fitting processing unit 25, the second graph generating unit 26, and the critical concentration detecting unit 27 execute the above processes on the graph generated from either the amplitude or a predetermined width and the surfactant concentration.

Further, the first and second embodiments are merely examples of implementation for carrying out the present invention, and the technical scope of the present invention is not interpreted to be limited by them. In other words, the present invention can be implemented in various ways without departing from the gist or main features thereof.

REFERENCE SIGNS LIST

11 Frequency spectrum acquiring unit
12 Thinning processing unit
13 Fitting processing unit
13A First fitting processing unit
13B Center frequency specifying unit
13C Second fitting processing unit
14 Graph generating unit
21 Frequency spectrum acquiring unit
22 Thinning processing unit
23 Fitting processing unit
24 Graph generating unit
25 Graph fitting processing unit
26 Second graph generating unit
27 Critical concentration detecting unit
101, 102 Terahertz wave signal analysis device

The invention claimed is:

1. A terahertz wave signal analysis device that analyzes a terahertz wave signal of a sample detected by a spectral device, comprising:
a frequency spectrum acquiring unit that obtains a frequency spectrum indicating a characteristic value for a frequency on the basis of the terahertz wave signal;
a fitting processing unit that fits synthetic waveforms of a plurality of fitting functions to the frequency spectrum obtained by the frequency spectrum acquiring unit; and
a graph generating unit that generates a graph different from the frequency spectrum using at least one value deciding properties of the plurality of fitting functions used in the fitting.

2. The terahertz wave signal analysis device according to claim 1, further comprising, a thinning processing unit that thins out the characteristic value at a frequency at which absorption of a terahertz wave by vapor other than the sample is increased among the characteristic values for each frequency in the frequency spectrum obtained by the frequency spectrum acquiring unit,
wherein the fitting processing unit fits the synthetic waveforms of the plurality of fitting functions to the characteristic value after being thinned out by the thinning processing unit.

3. The terahertz wave signal analysis device according to claim 2, wherein the fitting processing unit performs the fitting using a plurality of normal distribution functions which differ in at least one of a center frequency, an amplitude, and a width as the plurality of fitting functions, and
the graph generating unit generates the graph using the at least one of the center frequencies of the plurality of normal distribution functions used in the fitting, amplitudes at the center frequencies, and a predetermined width.

4. The terahertz wave signal analysis device according to claim 1, wherein the fitting processing unit performs the fitting using a plurality of normal distribution functions which differ in at least one of a center frequency, an amplitude, and a width as the plurality of fitting functions, and
the graph generating unit generates the graph using the at least one of the center frequencies of the plurality of normal distribution functions used in the fitting, amplitudes at the center frequencies, and a predetermined width.

5. The terahertz wave signal analysis device according to claim 4, wherein the fitting processing unit calculates the plurality of normal distribution functions of minimizing a residual error between a characteristic value at each frequency of the frequency spectrum and a value of the synthetic waveform at each frequency corresponding to the characteristic value through an optimization calculation using the at least one of the center frequency, the amplitude, and the width as a variable.

6. The terahertz wave signal analysis device according to claim 4, wherein the fitting processing unit includes
   a first fitting processing unit that performs the fitting for the frequency spectrum with the synthetic waveforms of the plurality of normal distribution functions which differ in at least the center frequency using the center frequency, the amplitude, and the width as parameters for each of the plurality of frequency spectrums obtained by the frequency spectrum acquiring unit for a plurality of samples,
   a center frequency specifying unit that specifies a total of n center frequencies by grouping the center frequencies of the normal distribution functions used in the fitting for the plurality of frequency spectrums by the first fitting processing unit and specifying one or more representative center frequencies from each group, and
   a second fitting processing unit that fixes the n center frequencies specified by the center frequency specifying unit to each of the plurality of frequency spectrums obtained by the frequency spectrum acquiring unit for a plurality of samples and performs the fitting for the frequency spectrum with synthetic waveforms of the n normal distribution functions using the amplitude and the width as parameters, and
   the graph generating unit generates a graph using at least one of the center frequency, the amplitude, and the width of the n normal distribution functions used in the fitting by the second fitting processing unit.

7. The terahertz wave signal analysis device according to claim 4, wherein the graph generating unit calculates an area of a predetermined region of the normal distribution waveform from the amplitude and the width and generates a graph illustrating a relation between the center frequency and the above area.

8. The terahertz wave signal analysis device according to claim 7, wherein the graph generating unit generates a radar graph in which the plurality of center frequencies are used as a plurality of axes, and the area is indicated as a value of each axis.

9. The terahertz wave signal analysis device according to claim 4, wherein the frequency spectrum acquiring unit obtains the frequency spectrum for each concentration of a predetermined substance having an amphiphilic molecule on the basis of a plurality of terahertz wave signals detected by the spectral device for a plurality of the samples including a predetermined substance-mixed aqueous solution generated by changing the concentration of the predetermined substance,
   the fitting processing unit executes the fitting process for the plurality of frequency spectrums obtained for each concentration of the predetermined substance by the frequency spectrum acquiring unit for each concentration of the predetermined substance, and
   the graph generating unit generates an explicit or implicit graph in which any one of the amplitude at the center frequency, a predetermined width, or an area of a predetermined region of the normal distribution waveform calculated from the amplitude and the predetermined width is used as an index value, and the index value and the concentration of the predetermined substance are used as axis of two directions.

10. The terahertz wave signal analysis device according to claim 9, further comprising, a graph fitting processing unit that divides the graph generated by the graph generating unit into a plurality of regions in an axial direction of the concentration, fits a value of a predetermined graph fitting function indicating a relation between the concentration and the index value to each index value for each concentration included in a region for each divided region, and performs an optimization calculation of minimizing a residual error between each index value for each concentration and the value of the graph fitting function using a concentration of a boundary dividing the region and a coefficient of the graph fitting function as variables.

11. The terahertz wave signal analysis device according to claim 10, further comprising, a second graph generating unit that generates a graph indicated by the graph fitting function in a plurality of regions divided in the axial direction of the concentration by the boundary in accordance with the concentration of the boundary and the coefficient of the graph fitting function obtained by the optimization calculation of the graph fitting processing unit.

12. The terahertz wave signal analysis device according to claim 10, further comprising, a critical concentration detecting unit that calculates the value of the graph fitting function for the concentration of the boundary obtained by the optimization calculation for each of the graph fitting functions in the plurality of regions in accordance with the coefficient of the graph fitting function in a plurality of regions obtained by the optimization calculation of the graph fitting processing unit, and detects the concentration of the boundary as a critical concentration when each calculated value deviates by a predetermined value or more.

13. A terahertz wave signal analysis method of analyzing a terahertz wave signal of a sample detected by a spectral device through a terahertz wave signal analysis device, comprising:
   a first step of obtaining, by a frequency spectrum acquiring unit of the terahertz wave signal analysis device, a frequency spectrum indicating a characteristic value for a frequency on the basis of the terahertz wave signal;
   a second step of fitting, by a fitting processing unit of the terahertz wave signal analysis device, synthetic waveforms of a plurality of fitting functions to the frequency spectrum obtained by the frequency spectrum acquiring unit; and
   a third step of generating, by a graph generating unit of the terahertz wave signal analysis device, a graph different from the frequency spectrum using at least one value deciding properties of the plurality of fitting functions used in the fitting.

14. The terahertz wave signal analysis method according to claim 13, wherein, in the first step, the frequency spectrum acquiring unit obtains the frequency spectrum for each concentration of a predetermined substance having an amphiphilic molecule on the basis of a plurality of terahertz wave signals detected by the spectral device for a plurality of the samples including a predetermined substance-mixed aqueous solution generated by changing the concentration of the predetermined substance,
   in the second step, the fitting processing unit executes a fitting process for the plurality of frequency spectrums obtained for each concentration of the predetermined substance by the frequency spectrum acquiring unit for each concentration of the predetermined substance using a plurality of normal distribution functions which differ in at least one of a center frequency, an amplitude, and a width as the plurality of fitting functions, and
   in the third step, the graph generating unit uses any one of the amplitude at the center frequency, a predetermined width, or an area of a predetermined region of the normal distribution waveform calculated from the amplitude and the predetermined width as an index value, and generates an explicit or implicit graph having the index value and the concentration of the predetermined substance as axis of two directions.

15. The terahertz wave signal analysis method according to claim 14, further comprising, a fourth step of dividing, by the graph fitting processing unit of the terahertz wave signal analysis device, the graph generated by the graph generating unit into a plurality of regions in an axial direction of the concentration, fitting a value of a predetermined graph fitting function indicating a relation between the concentration and the index value to each index value for each concentration included in a region for each divided region, and performing an optimization calculation of minimizing a residual error between each index value for each concentration and the value of the graph fitting function using a concentration of a boundary dividing the region and a coefficient of the graph fitting function as variables.

16. The terahertz wave signal analysis method according to claim 15, further comprising, a fifth step of generating, by a second graph generating unit of the terahertz wave signal analysis device, a graph indicated by the graph fitting function in a plurality of regions divided in the axial direction of the concentration by the boundary in accordance with the concentration of the boundary and the coefficient of the graph fitting function obtained by the optimization calculation of the graph fitting processing unit.

17. The terahertz wave signal analysis method according to claim 15, further comprising, a fifth step of calculating, by a critical concentration detection unit of the terahertz wave signal analysis device, the value of the graph fitting function for the concentration of the boundary obtained by the optimization calculation for each of the graph fitting functions in the plurality of regions in accordance with the coefficient of the graph fitting function in a plurality of regions obtained by the optimization calculation of the graph fitting processing unit, and detecting the concentration of the boundary as a critical concentration when each calculated value deviates by a predetermined value or more.

18. A non-transitory computer readable medium storing a terahertz wave signal analysis program that analyzes a terahertz wave signal of a sample detected by a spectral device, the terahertz wave signal analysis program causing a computer to function as: a frequency spectrum acquiring unit that obtains a frequency spectrum indicating a characteristic value for a frequency on the basis of the terahertz wave signal; a fitting processing unit that fits synthetic waveforms of a plurality of fitting functions to the frequency spectrum obtained by the frequency spectrum acquiring unit; and a graph generating unit that generates a graph different from the frequency spectrum using at least one value deciding properties of the plurality of fitting functions used in the fitting.

19. A non-transitory computer readable medium storing the terahertz wave signal analysis program according to claim 18, wherein the frequency spectrum acquiring unit obtains the frequency spectrum for each concentration of a predetermined substance having an amphiphilic molecule on the basis of a plurality of terahertz wave signals detected by the spectral device for a plurality of the samples including a plurality of predetermined substance-mixed aqueous solutions generated by changing the concentration of the predetermined substance, the fitting processing unit performs a fitting process for a plurality of frequency spectrums obtained for each concentration of the predetermined substance by the frequency spectrum acquiring unit for each concentration of the predetermined substance, and the graph generating unit generates an explicit or implicit graph in which any one of the amplitude at the center frequency, a predetermined width, or an area of a predetermined region of the normal distribution waveform calculated from the amplitude and the predetermined width is used as an index value, and the index value and the concentration of the predetermined substance are used as axis of two directions using a plurality of normal distribution functions which differ in at least one of a center frequency, an amplitude, and a width as the plurality of fitting functions.

20. A non-transitory computer readable medium storing the terahertz wave signal analysis program according to claim 19 causing the computer to further function as: a graph fitting processing unit that divides the graph generated by the graph generating unit into a plurality of regions in an axial direction of the concentration, fits a value of a predetermined graph fitting function indicating a relation between the concentration and the index value to each index value for each concentration included in a region for each divided region, and performs an optimization calculation of minimizing a residual error between each index value for each concentration and the value of the graph fitting function using a concentration of a boundary dividing the region and a coefficient of the graph fitting function as variables.

21. A non-transitory computer readable medium storing the terahertz wave signal analysis program according to claim 20 causing the computer to further function as: a second graph generating unit that generates a graph indicated by the graph fitting function in a plurality of regions divided in the axial direction of the concentration by the boundary in accordance with the concentration of the boundary and the coefficient of the graph fitting function obtained by the optimization calculation of the graph fitting processing unit.

22. A non-transitory computer readable medium storing the terahertz wave signal analysis program according to claim 20 causing the computer to further function as: a critical concentration detecting unit that calculates the value of the graph fitting function for the concentration of the boundary obtained by the optimization calculation for each of the graph fitting functions in the plurality of regions in accordance with the coefficient of the graph fitting function in a plurality of regions obtained by the optimization calculation of the graph fitting processing unit, and detects the concentration of the boundary as a critical concentration when each calculated value deviates by a predetermined value or more.

* * * * *